(12) United States Patent
Kwon et al.

(10) Patent No.: US 7,602,047 B2
(45) Date of Patent: Oct. 13, 2009

(54) SEMICONDUCTOR DEVICE HAVING THROUGH VIAS

(75) Inventors: Yong-Chai Kwon, Suwon-si (KR); Dong-Ho Lee, Seongnam-si (KR); In-Young Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 11/979,562

(22) Filed: Nov. 6, 2007

(65) Prior Publication Data

US 2008/0150089 A1   Jun. 26, 2008

(30) Foreign Application Priority Data

Nov. 6, 2006   (KR) .................. 10-2006-0109132

(51) Int. Cl.
*H01L 29/40* (2006.01)

(52) U.S. Cl. .................. 257/621; 257/626; 257/E23.01; 438/637; 438/667

(58) Field of Classification Search .................. 257/621, 257/626, E23.01, E21.495; 438/637, 667, 438/672, 675

See application file for complete search history.

(56) References Cited

U.S. PATENT DOCUMENTS 6,667,551 B2   12/2003   Hanaoka et al.

| | | | |
|---|---|---|---|
| 7,358,602 B2 * | 4/2008 | Hara | 257/689 |
| 7,413,979 B2 * | 8/2008 | Rigg et al. | 438/667 |
| 2004/0192033 A1 | 9/2004 | Hara | |
| 2006/0019467 A1 * | 1/2006 | Lee et al. | 438/462 |
| 2007/0131997 A1 * | 6/2007 | Ohtsuka et al. | 257/301 |

FOREIGN PATENT DOCUMENTS

| | | |
|---|---|---|
| JP | 2001-203316 | 7/2001 |
| JP | 2004-221348 | 8/2004 |
| JP | 2004-335647 | 11/2004 |
| JP | 2005-310817 | 11/2005 |
| KR | 1020010076331 | 8/2001 |
| KR | 1020060010099 | 2/2006 |

* cited by examiner

*Primary Examiner*—Phuc T Dang
(74) *Attorney, Agent, or Firm*—Harness, Dickey & Pierce, P.L.C.

(57) ABSTRACT

A method of fabricating a semiconductor device is provided. The method may include forming an insulating layer on a wafer. The wafer may have an active surface and an inactive surface which face each other, and the insulating layer may be formed on the active surface. A pad may be formed on the insulating layer, and a first hole may be formed in the insulating layer. A first hole insulating layer may then be formed on an inner wall of the first hole. A second hole may be formed under the first hole. The second hole may be formed to extend from the first hole into the wafer. A second hole insulating layer may be formed on an inner wall of the second hole. The semiconductor device fabricated according to the method may also be provided.

8 Claims, 22 Drawing Sheets

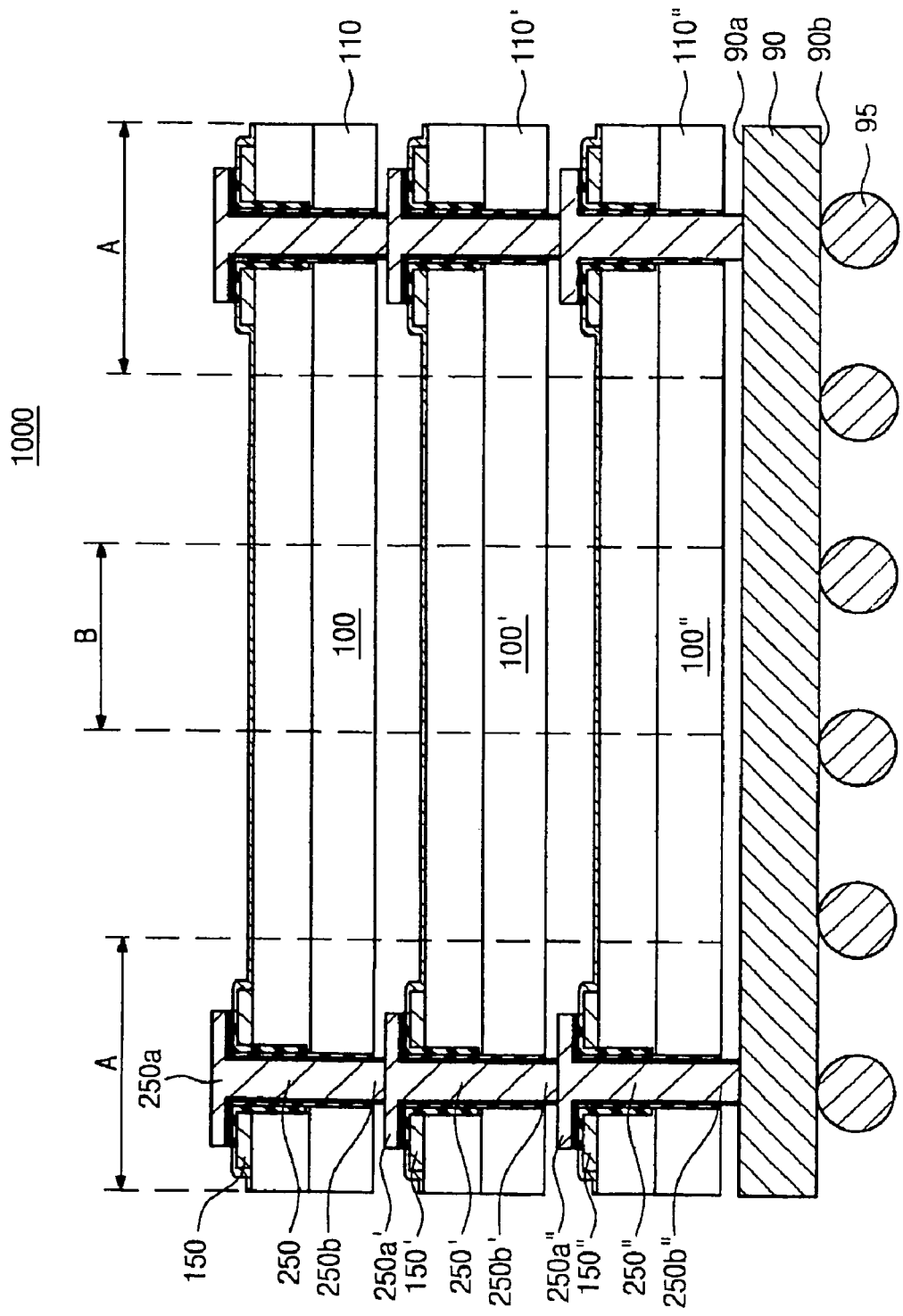

SEMICONDUCTOR DEVICE HAVING THROUGH VIAS

PRIORITY STATEMENT

This application claims priority under 35 U.S.C. §119 to Korean Patent Application No. 10-2006-109132, filed Nov. 6, 2006, in the Korean Intellectual Property Office (KIPO), the entire contents of which are incorporated herein by reference.

BACKGROUND

1. Field

Example embodiments relate to semiconductor devices and methods of fabricating the same. Other example embodiments relate to semiconductor devices having through vias and methods of fabricating the same.

2. Description of the Related Art

A technique for more densely packaging semiconductor devices has been increasingly demanded with the development of lighter, smaller, faster, and improved performance in more sophisticated electronic products. In response to such a demand, packaging techniques (e.g., assembly techniques) for three dimensionally stacking semiconductor chips have been proposed. For example, a technique for electrically connecting a plurality of semiconductor chips stacked on a board with use of through vias has been employed in a semiconductor assembly process.

The through vias may be mainly formed in scribe lanes of the respective semiconductor chips, and the through vias may be electrically connected to input/output (I/O) pads of the corresponding semiconductor chip via redistributed interconnections. The scribe lanes may be wider than the width of the through vias. However, the area that the scribe lanes occupy may be reduced in order to increase the number of the semiconductor chips at a wafer level. In addition, a sawing technique for separating the semiconductor chips formed on a single wafer from one another has been improved. The improved sawing technique allows a reduction of the width of the scribe lane.

However, there may be a limitation in reducing the width of the scribe lanes when the through vias penetrating the scribe lanes are used. For example, if the I/O pads of the semiconductor chips are disposed at a central region of the semiconductor chips, employing the through vias formed in the scribe lanes may be difficult. Relatively long redistributed interconnections may be required to electrically connect the I/O pads to the through vias and the relatively long redistributed interconnections may cause malfunction of the semiconductor chips due to parasitic capacitance or inductance thereof.

FIGS. 1A to 1D are cross sectional views illustrating a conventional method of fabricating a semiconductor device having through vias. Referring to FIG. 1A, a semiconductor chip 10 may include a wafer 11 which is composed of semiconductor elements, e.g., silicon. An insulating layer 13 may be formed on a top surface 11a of the wafer 11, and an input/output (I/O) pad 15 may be formed on the insulating layer 13. Patterns (not shown) constituting internal circuits may be formed in the insulating layer 13. A passivation layer 17 may be formed on the insulating layer 13 to protect the internal circuit and a portion of the I/O pad 15 from an external environment. The I/O pad 15, the insulating layer 13 and the wafer 11 may be etched to form a hole 19 in the wafer 11. The hole 19 may penetrate the I/O pad 15 and the insulating layer 13.

Referring to FIG. 1B, a hole insulating layer 21 may be formed on an inner wall 19a of the hole 19, and an electrode 25 may be formed to fill the hole 19 which is surrounded by the hole insulating layer 21. The electrode 25 may be configured to connect to the I/O pad 15 even though it is not shown in FIG. 1B. A base layer 23 may be formed on the hole insulating layer 21 prior to formation of the electrode 25. The base layer 23 may include a barrier layer and/or a seed layer.

Referring to FIG. 1C, a lower portion of the wafer 11 may be removed such that a lower portion 25b of the electrode 25 may protrude from a bottom surface 11b of the wafer 11. The electrode 25 may completely penetrate the wafer 11, thereby acting as a through via. The conventional method described above may exhibit some disadvantages, as illustrated in FIG. 1D.

Referring to FIG. 1D, fragments of the wafer 11 may be generated during formation of the hole 19, and the fragments of the wafer 11 may adhere onto the I/O pad 15 along the sidewall 19a of the hole 19. A layer 12 composed of the fragments may be formed on the sidewall 19a of the hole 19. Accordingly, even though the hole insulating layer 21 is formed on the sidewall 19a of the hole 19, the I/O pad 15 may be electrically connected to the wafer 11 through the layer 12. In other words, electrical shortage between the I/O pad 15 and the wafer 11 may occur due to a silicon splash phenomenon during formation of the hole 19.

SUMMARY

Example embodiments are directed to a method of fabricating a semiconductor device. The method may include forming an insulating layer on a wafer. The wafer may have an active surface and an inactive surface which face each other, and the insulating layer may be formed on the active surface. A pad may be formed on the insulating layer. A first hole may be formed in the insulating layer, and a first hole insulating layer may be formed on an inner wall of the first hole. A second hole may be formed under the first hole. The second hole may extend from the first hole into the wafer. A second hole insulating layer may be formed on an inner wall of the second hole.

In example embodiments, the first hole may be formed by removing a portion of the insulating layer not exposing the active surface. The first hole may be formed by removing a portion of the pad to penetrate the pad. The second hole may be formed by removing the insulating layer under the first hole and a portion of the wafer. Removal of the insulating layer under the first hole may include removing a portion of the insulating layer so that a portion of a bottom surface of the first hole remains. Alternatively, removal of the insulating layer under the first hole may include etching the insulating layer using a sidewall of the first hole insulating layer as an etching mask.

In example embodiments, the first hole insulating layer may be formed to cover a portion of the pad. In example embodiments, the second hole insulating layer may be formed on the first hole insulating layer in addition to the inner wall of the second hole. In example embodiments, the method may further include filling the first and second holes with a conductive layer to form a through via and removing a portion of the wafer adjacent to the inactive surface to expose a portion of the through via. The through via may be exposed by removing a portion of the wafer until a lower portion of the through via is not exposed and removing a portion of the wafer to protrude the lower portion of the through via. Alternatively, the through via may be exposed using a single process, and a portion of the through via may be removed during the single process. A connector may be additionally attached to the exposed surface of the through via after exposure of the through via.

Example embodiments may be directed to a semiconductor device. The semiconductor device may include a wafer having an active surface and an inactive surface which face each other. An insulating layer may be disposed on the active surface, and a pad may be disposed on the insulating layer. A passivation layer may cover a portion of the pad. A through via hole may penetrate the insulating layer and may extend into the wafer. The through via hole may include a first hole in the insulating layer and a second hole extending from the first hole into the wafer. A hole insulating layer may be disposed on the inner wall of the through via hole. The hole insulating layer may include a multi-layered insulating layer on an inner wall of the first hole and a single layered insulating layer on an inner wall of the second hole. A through via may fill the through via hole.

In example embodiments, a bottom surface of the first hole may be located in the insulating layer to leave a portion of the insulating layer between the bottom surface of the first hole and the active surface of the wafer. The first hole may include a first sidewall and a bottom surface, and the second hole may include a second sidewall extending from the bottom surface of the first hole. The hole insulating layer may include a first hole insulating layer and a second hole insulating layer. The first hole insulating layer may be disposed on the first sidewall and the bottom surface, and the second hole insulating layer may be disposed on the first sidewall, the second sidewall and the bottom surface. Alternatively, the first hole may include a first sidewall, and the second hole may include a second sidewall extending from the first sidewall of the first hole. The hole insulating layer may include a first hole insulating layer and a second hole insulating layer. The first hole insulating layer may be disposed on the first sidewall, and the second hole insulating layer may be disposed on the first sidewall and the second sidewall.

In example embodiments, the first hole may have a first width, and the second hole may have a second width which is equal to or less than the first width. In example embodiments, the through via may include an upper portion that penetrates the pad to protrude from the active surface and a lower portion which is exposed through the inactive surface. The lower portion of the through via may protrude from the inactive surface.

In example embodiments, the semiconductor may further include a connector attached to a lower portion of the through via, which is adjacent to the inactive surface. In example embodiments, the semiconductor device may further include a base layer between the whole insulating layer and the through via. In example embodiments, the hole insulating layer may cover a portion of the pad, which is not covered with the passivation layer.

BRIEF DESCRIPTION OF THE DRAWINGS

Example embodiments will be more clearly understood from the following detailed description taken in conjunction with the accompanying drawings. FIGS. 1A-9 represent non-limiting, example embodiments as described herein.

FIGS. 1A to 1D are cross sectional views illustrating a method of fabricating a conventional semiconductor chip with through vias;

FIG. 3 is a cross sectional view illustrating a multi chip package including a plurality of semiconductor chips fabricated according to example embodiments;

FIG. 5 is a cross sectional view illustrating a multi chip package including a plurality of semiconductor chips fabricated according to example embodiments;

FIG. 7 is a cross sectional view illustrating a multi chip package including a plurality of semiconductor chips fabricated according to example embodiments;

FIG. 9 is a cross sectional view illustrating a multi chip package including a plurality of semiconductor chips fabricated according to example embodiments.

Figure 1A:
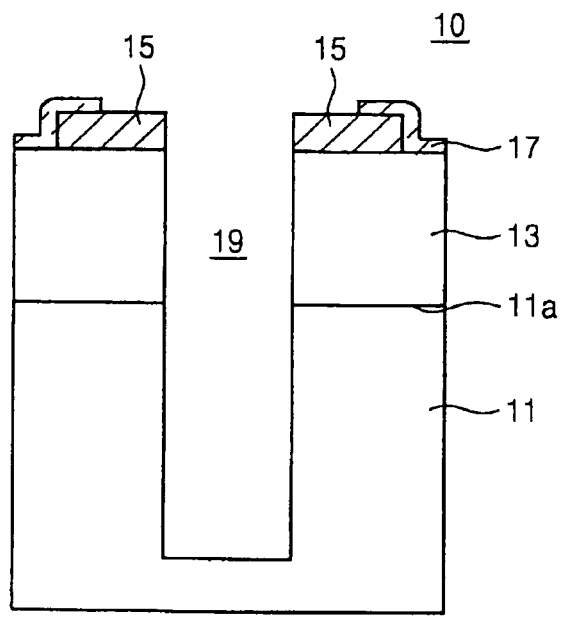
Figure 1B:
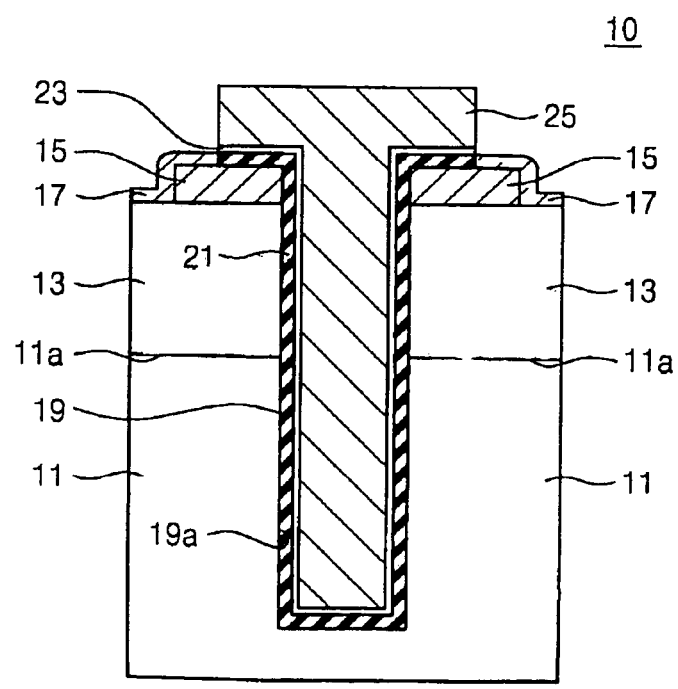
Figure 1C:
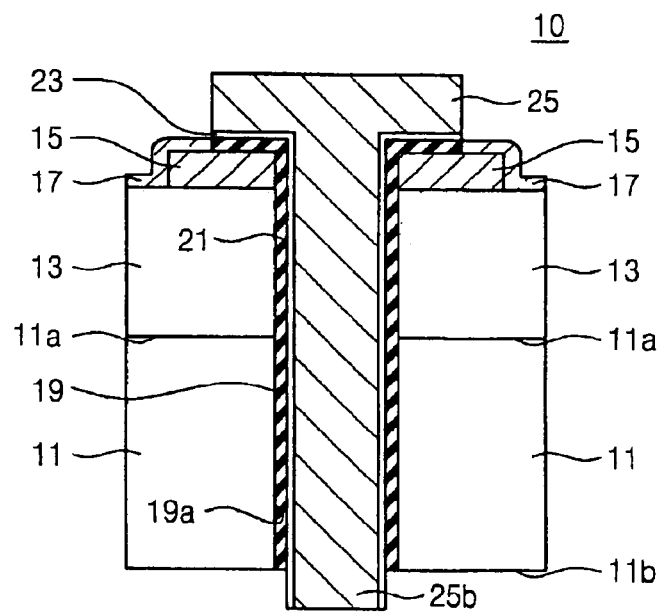
Figure 1D:
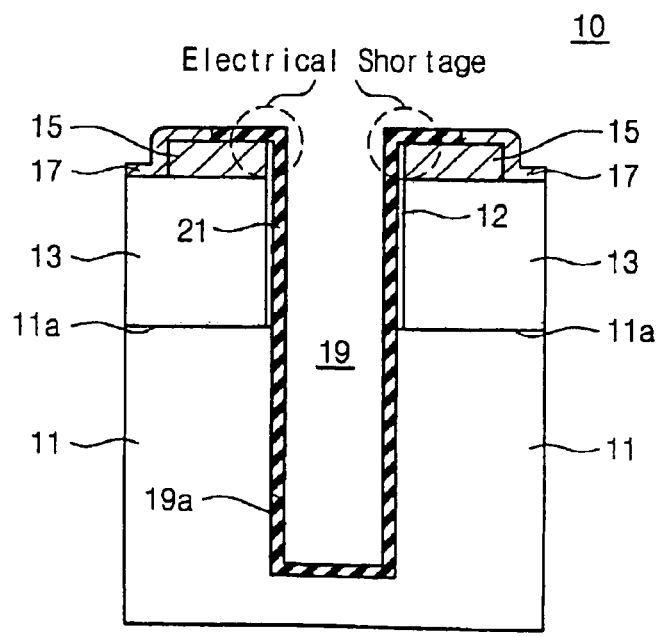

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully hereinafter with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. As used herein, the term "and/or" includes any and all combinations of one or more of the associated listed items. Like numbers refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
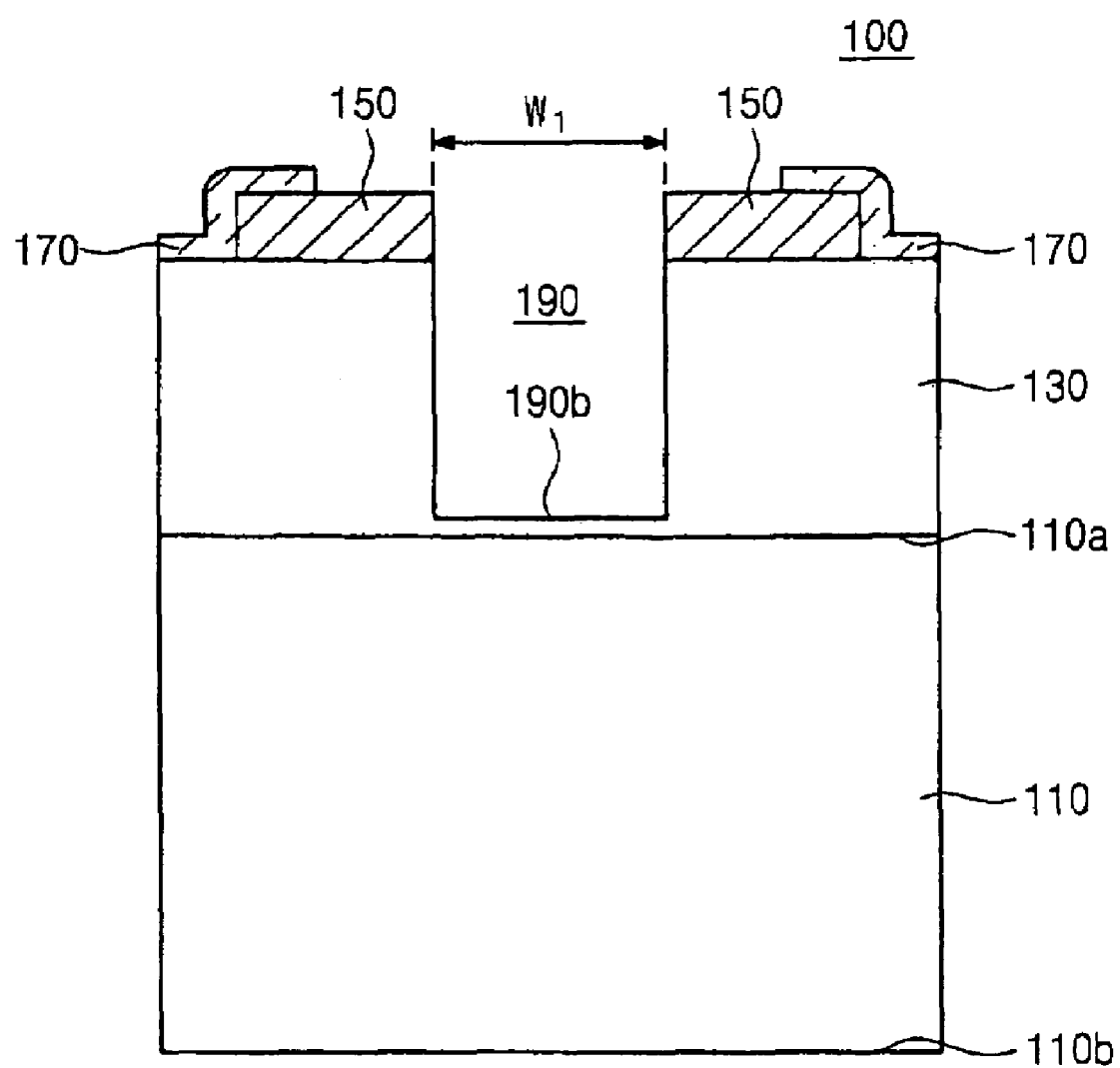
FIGS. 2A to 2H are cross sectional views illustrating methods of fabricating a semiconductor chip with through vias according to example embodiments.

FIGS. 2A to 2H are cross sectional views illustrating a method of fabricating a semiconductor device according to example embodiments. Referring to FIG. 2A, a semiconductor chip 100 may be provided. The semiconductor chip 100 may include a wafer 110, which is a semiconductor substrate, e.g., a silicon substrate. The wafer 110 may have an active surface 110a and an inactive surface 110b which face each other. The active surface 110a may be a front surface of the wafer 110 and the inactive surface 110b may be a back surface of the wafer 110. An insulating layer 130 may be formed on the active surface 110a of the wafer 110, and circuit patterns (not shown) may be formed in the insulating layer 130. An input/output (I/O) pad 150 may be provided on the insulating layer 130. The pad 150 may be formed on a center region or an edge region of the semiconductor chip 100. A passivation layer 170 may be formed on the insulating layer 130. The passivation layer 170 may be formed of silicon oxide, silicon nitride and/or other insulator materials. Further, the passivation layer 170 may be formed to cover a portion of the pad 150. The passivation layer 170 may be formed to protect the circuit patterns from an external environment.

A first hole 190 having a first width $W_1$ may be formed to penetrate a portion of the pad 150 and extend into the insulating layer 130. For example, the first hole 190 may be formed to penetrate a center region of the pad 150, as shown in FIG. 2A. The first hole 190 may be formed using a laser drilling technique and/or a plasma etching technique well known in the art. In the event that the laser drilling technique is used in formation of the first hole 190, any photo masks and any photolithography processes may not be required. Further, the size (e.g., the first width $W_1$ and a depth) of the first hole 190 may be more easily controlled with a laser drilling technique. The first hole 190 may be formed so that the active surface 110a may not be exposed. For example, the first hole 190 may have a depth which is less than a thickness of the insulating layer 130. When the laser drilling technique is used to form the first hole 190, a bottom surface 190b of the first hole 190 may be located over the active surface 110a by appropriately adjusting a pulse width and/or intensity of the laser.

Figure 2B:
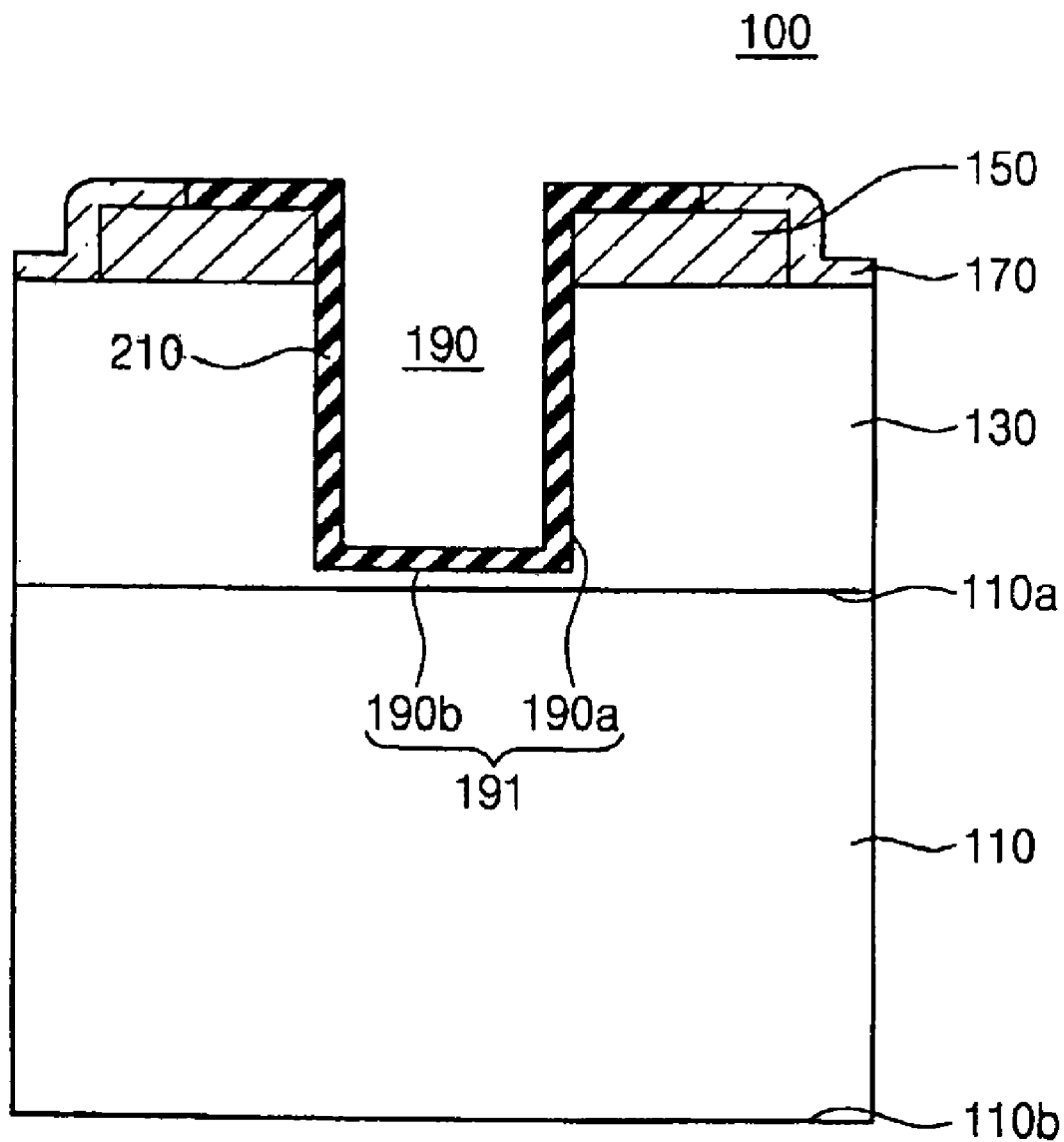

Referring to FIG. 2B, a first hole insulating layer 210 may be formed on an inner wall 191 of the first hole 190, which includes a sidewall 190a and the bottom surface 190b. The first hole insulating layer 210 may be formed of a silicon oxide (SiO) layer and/or a silicon nitride (SiN) using a chemical vapor deposition (CVD) technique. Alternatively, the first hole insulating layer 210 may be formed of an insulator, e.g., polymer using a spin coating technique and/or a sublimation technique. The first hole insulating layer 210 may be formed to completely cover the pad 150, as shown in FIG. 2B. The pad 150 may be electrically connected to the wafer 110 during formation of a second hole (see number 200 of FIG. 2C) in a subsequent process if the pad 150 is not completely covered with the first hole insulating layer 210.

Figure 2C:
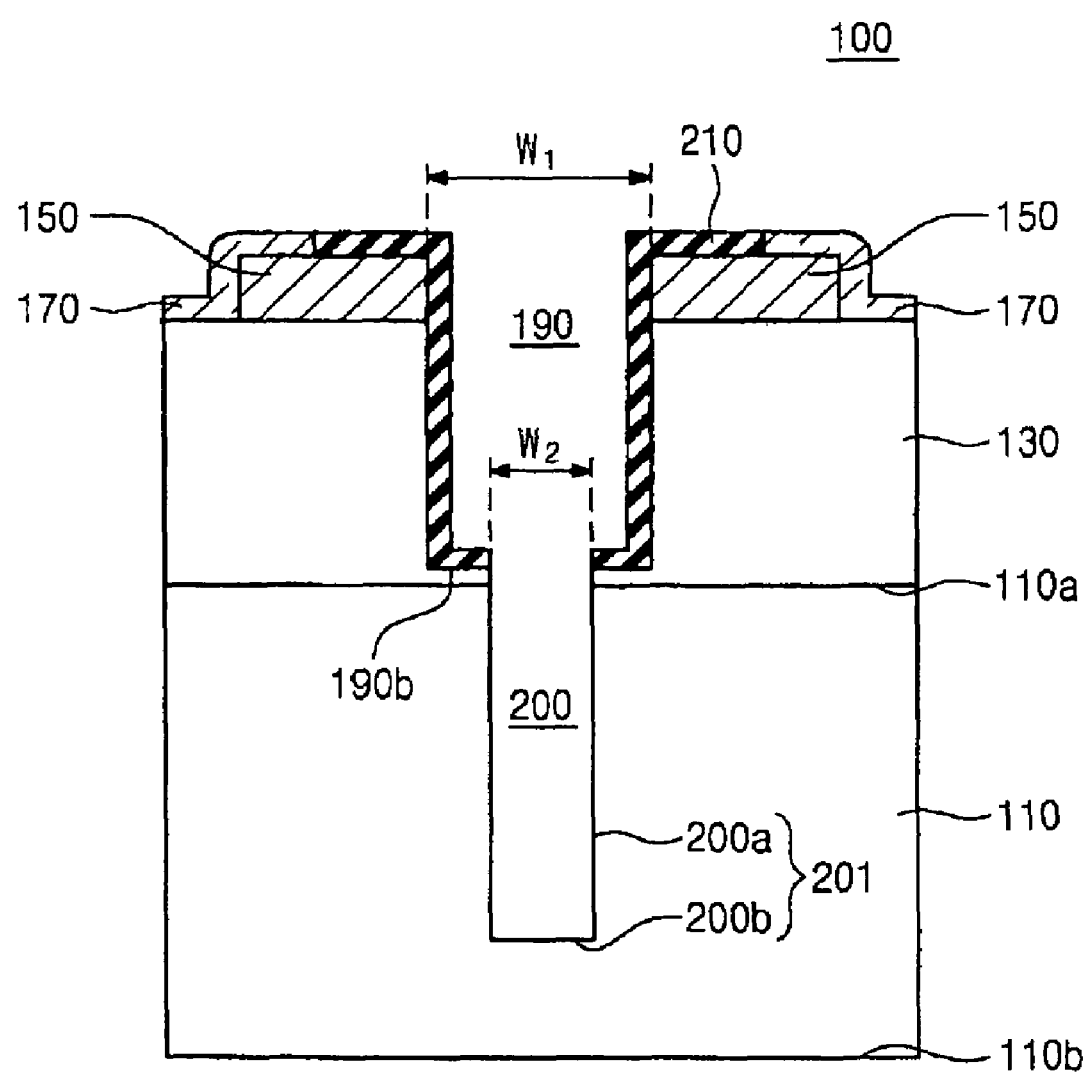

Referring to FIG. 2C, a second hole 200 may be formed in the wafer 110 extending from the first hole 190. The second hole 200 may have a second width $W_2$ less than the first width $W_1$. The second hole 200 may have an inner wall 201 including a sidewall 200a and a bottom surface 200b. The first hole insulating layer 210 on the edge of the bottom surface 190b may still remain even after formation of the second hole 200. In addition, the second hole 200 may be formed so that the bottom surface 200b may be located between the active surface 110a and the inactive surface 110b.

The second hole 200 may also be formed using a laser drilling technique by which the second width $W_2$ and a depth of the second hole 200 may be more easily controlled. Fragments of the wafer 110 may be generated during formation of the second hole 200, and the fragments of the wafer 110 may adhere onto the sidewall of the first hole 190. However, even though the fragments of the wafer 110 adhere onto the sidewall of the first hole 190, the wafer 110 may be electrically insulated from the pad 150. This is due to the presence of the first hole insulating layer 210 that covers the pad 150.

Figure 2D:
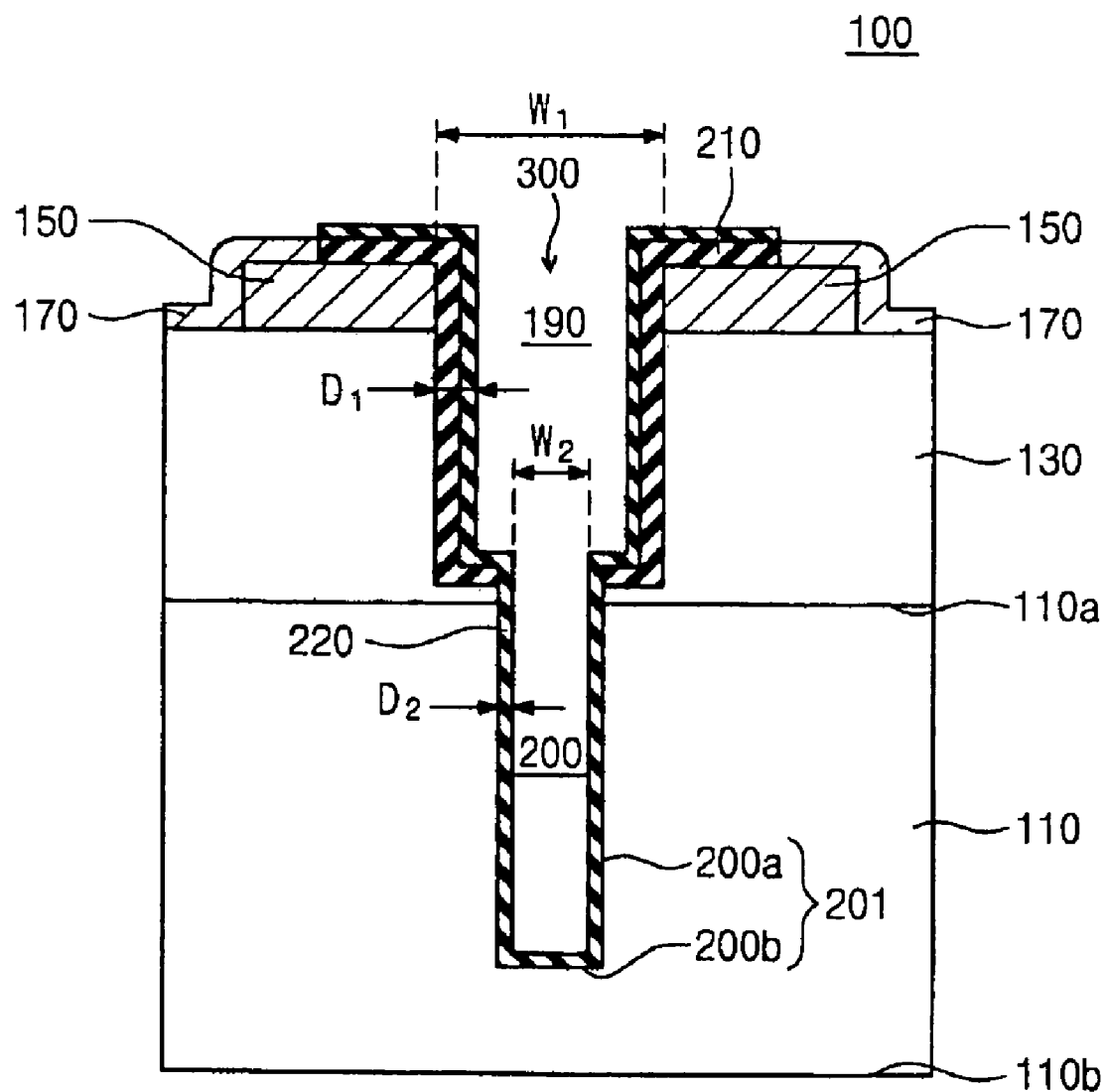

Referring to FIG. 2D, a second hole insulating layer 220 may be formed on the inner wall 201 of the second hole 200 and also formed on the first hole insulating layer 210. The second hole insulating layer 220 may also be formed of a silicon oxide (SiO) layer and/or a silicon nitride (SiN) layer using a chemical vapor deposition (CVD) technique. Alternatively, the second hole insulating layer 220 may be formed of an insulator, e.g., polymer using a spin coating technique and/or a sublimation technique. A double layered insulating layer having a first thickness $D_1$ may be formed in the first hole 190, and a single layered insulating layer having a second thickness $D_2$, which is less than the first thickness $D_1$, may be formed in the second hole 200. The double layered insulating layer may include the first and second hole insulating layers 210 and 220, and the single layered insulating layer may include only the second hole insulating layer 220. The first hole 190 and the second hole 200 may constitute a through via hole 300.

Figure 2E:
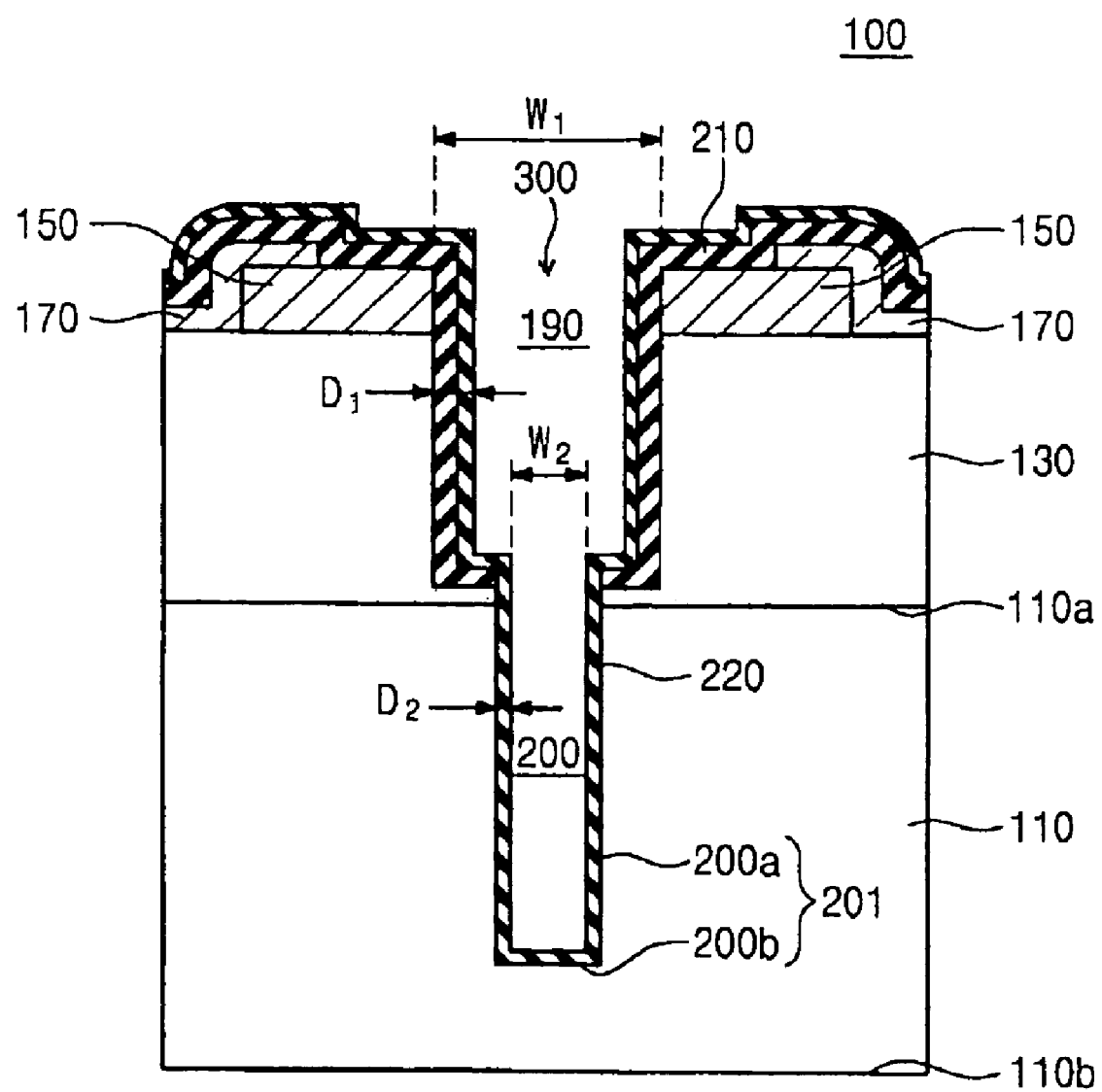

Alternatively, as illustrated in FIG. 2E, the first and second hole insulating layers 210 and 220 may be formed on the entire exposed surface of the insulating layer 130. This modified structure may be applied in other example embodiments described later.

Figure 2F:
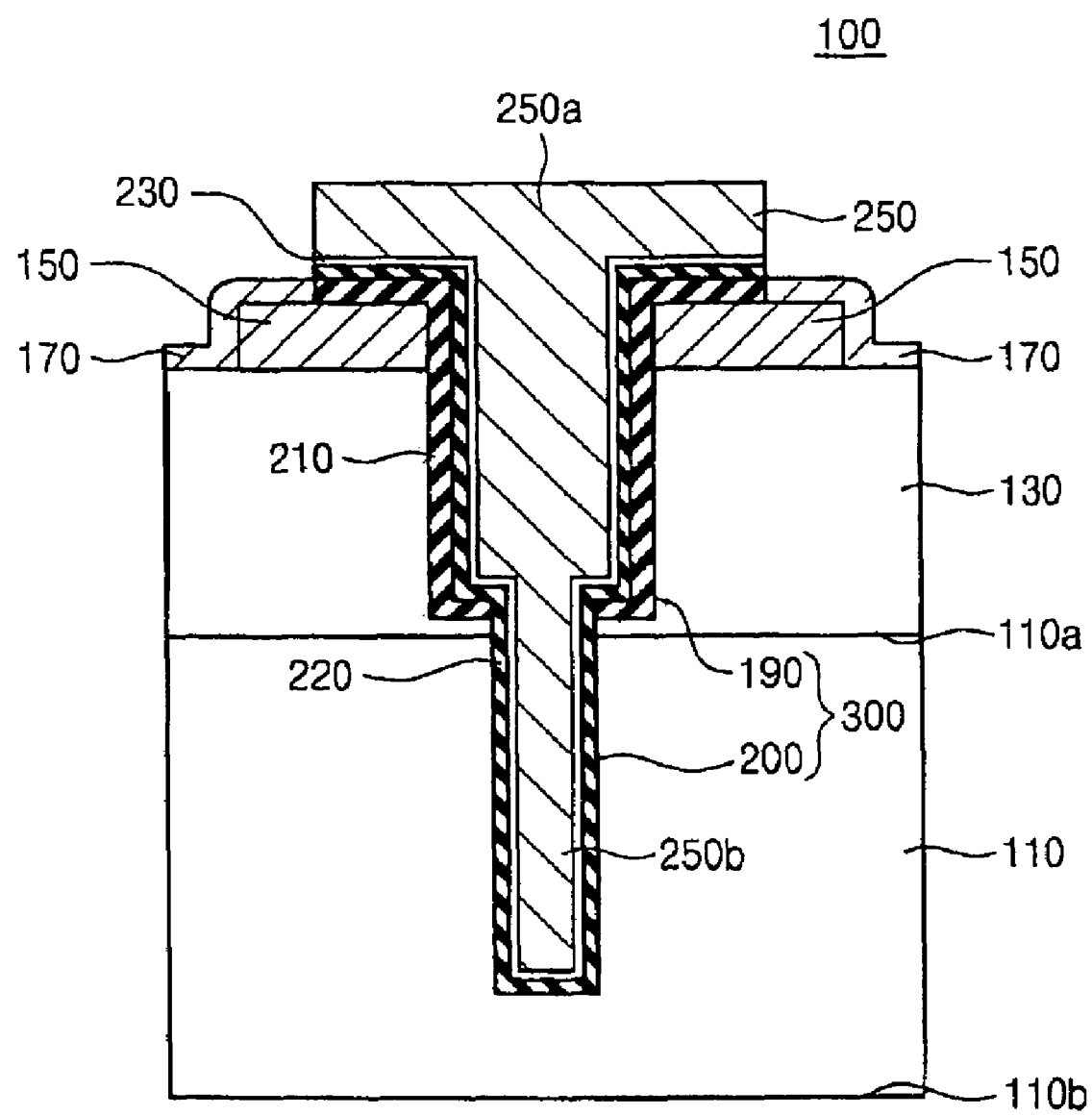
Figure 2G:
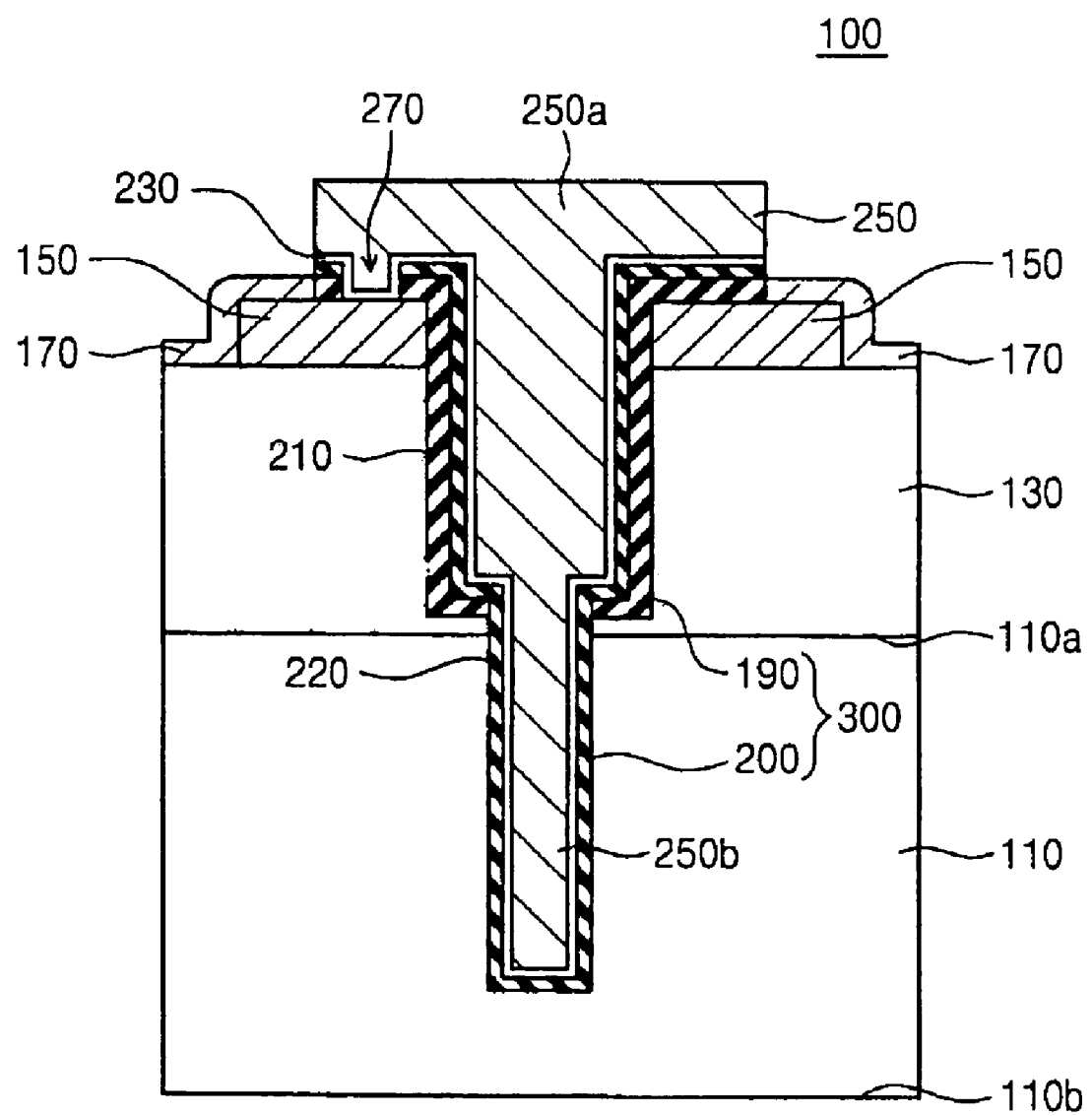

Referring to FIG. 2F, a conductive layer (not shown) may fill the through via hole 300 to form a through via 250. A base layer 230 may be formed on the second hole insulating layer 220 prior to formation of the through via 250. The base layer 230 may include a barrier layer and/or a seed layer. The through via 250 may be formed using an electroplating technique which is well known in the art. The through via 250 may be formed so that an upper portion 250a of the through via 250 extends to cover the pad 150. The through via 250 may be formed to be in contact with the pad 150 which is not shown in FIG. 2E. For example, as depicted in FIG. 2G, a portion of the insulating layers 210 and 220 on the pad 150 may be removed to form a hole 270 exposing a portion of the pad 150.

The through via 250 may contact the pad 150 through the hole 270. This electrical connection between the through via 25a and the pad 150 may be applied to other example embodiments described later. The through via 250 may be electrically connected to a predetermined or given circuit (not shown) formed in the insulating layer 130 via the pad 150.

The upper portion 250a of the through via 250 may be connected to a lower portion of a through via that penetrates a second semiconductor chip (not shown) stacked on the semiconductor chip 100. Similarly, a lower portion 250b of the through via 250 may be connected to an upper portion of a through via that penetrates a third semiconductor chip (not shown) located under the semiconductor chip 100. Thus, the lower portion 250b of the through via 250 may protrude from the wafer 110.

Figure 2H:
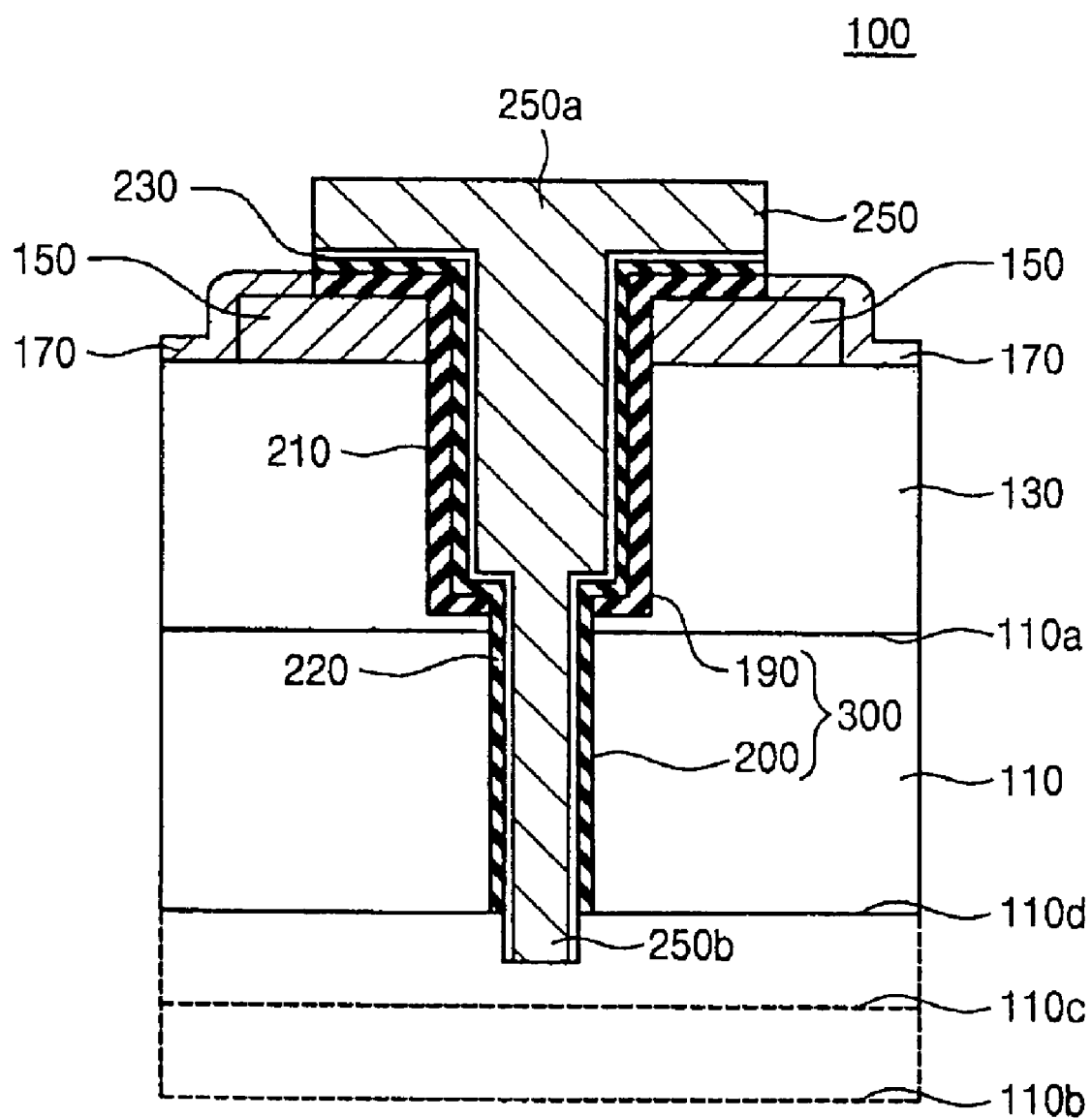

Referring to FIG. 2H, a back lapping process may be applied to the inactive surface 110b of the wafer 110 to remove a portion of the wafer 110. The back lapping process may be stopped before the lower portion 250b of the through via 250 is exposed. For example, the inactive surface 110b may be moved to a first surface 110c after the back lapping process. Subsequently, an etching process may be applied to the first surface 110c so that the lower portion 250b of the through via 250 may protrude from the through via 250. The first surface 110c may be moved to a second surface 110d after the etching process. Therefore, the lower portion 250b of the through via 250 may protrude from the second surface 110d of the wafer 110 after the etching process.

Figure 3:
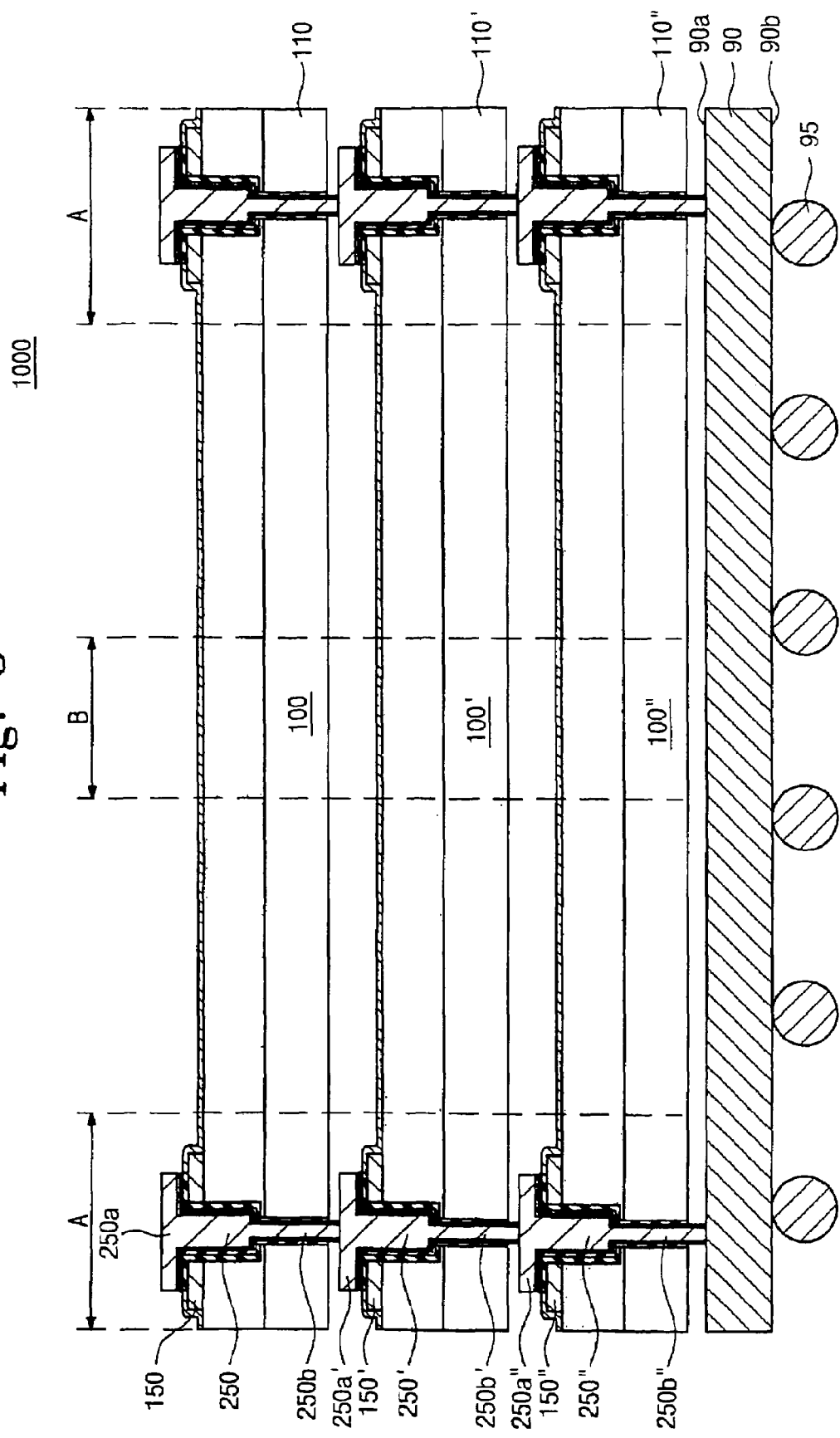

FIG. 3 is a cross sectional view illustrating a multi chip package including a plurality of semiconductor chips fabricated according to example embodiments. Referring to FIG. 3, a plurality of semiconductor chips 100, 100' and 100" may be stacked on a top surface 90a of a substrate 90. The substrate 90 may be PCB (printed circuit board). A plurality of external connectors 95, e.g., solder balls, may be attached on a bottom surface 90b of the substrate 90.

Through vias 250, 250' and 250" may penetrate the uppermost semiconductor chip 100, the intermediate semiconductor chip 100' and the lowermost semiconductor chip 100", respectively. The uppermost semiconductor chip 100 may include a wafer 110 and pads 150 arrayed over the wafer 110, and the intermediate chip 100' may include a wafer 110' and pads 150' arrayed over the wafer 110'. Similarly, the lowermost chip 100" may include a wafer 110" and pads 150" arrayed over the wafer 110".

A lower portion 250b of the through via 250 may be electrically connected to an upper portion 250a' of the through via 250', and a lower portion 250b' of the through via 250' may be electrically connected to an upper portion 250a" of the through via 250". In addition, a lower portion 250b" of the through via 250" may be electrically connected to a predetermined or given interconnection of the substrate 90. Therefore, example embodiments may provide a multi chip package 1000 that includes the plurality of stacked semiconductor chips 100, 100' and 100" with the through vias 250, 250' and 250".

In example embodiments, the through vias 250, 250' and 250" may be disposed at an edge A of the semiconductor chips 100, 100' and 100", as shown in FIG. 3. Example embodiments, however, are not limited to this. For example, at least one of the through vias 250, 250' and 250" may be disposed at a center region B of the semiconductor chips 100, 100' and 100". In other words, example embodiments may be applied to semiconductor chips having center pads.

Stacking the plurality of chips 100, 100' and 100" may be achieved at either chip level or wafer level. For example, the semiconductor chips 100, 100' and 100" may be separated from one another after fabrication of the semiconductor chips 100, 100' and 100" on some wafers, and the separated semiconductor chips 100, 100' and 100" may be mounted on the substrate 90. Alternatively, the semiconductor chips 100, 100' and 100" may be fabricated on some wafers, and the wafers including the semiconductor chips 100, 100' and 100" may be sequentially stacked on one another. Subsequently, the wafers may be divided into a plurality of chips to make a plurality of separated multi chip packages.

Figure 4A:
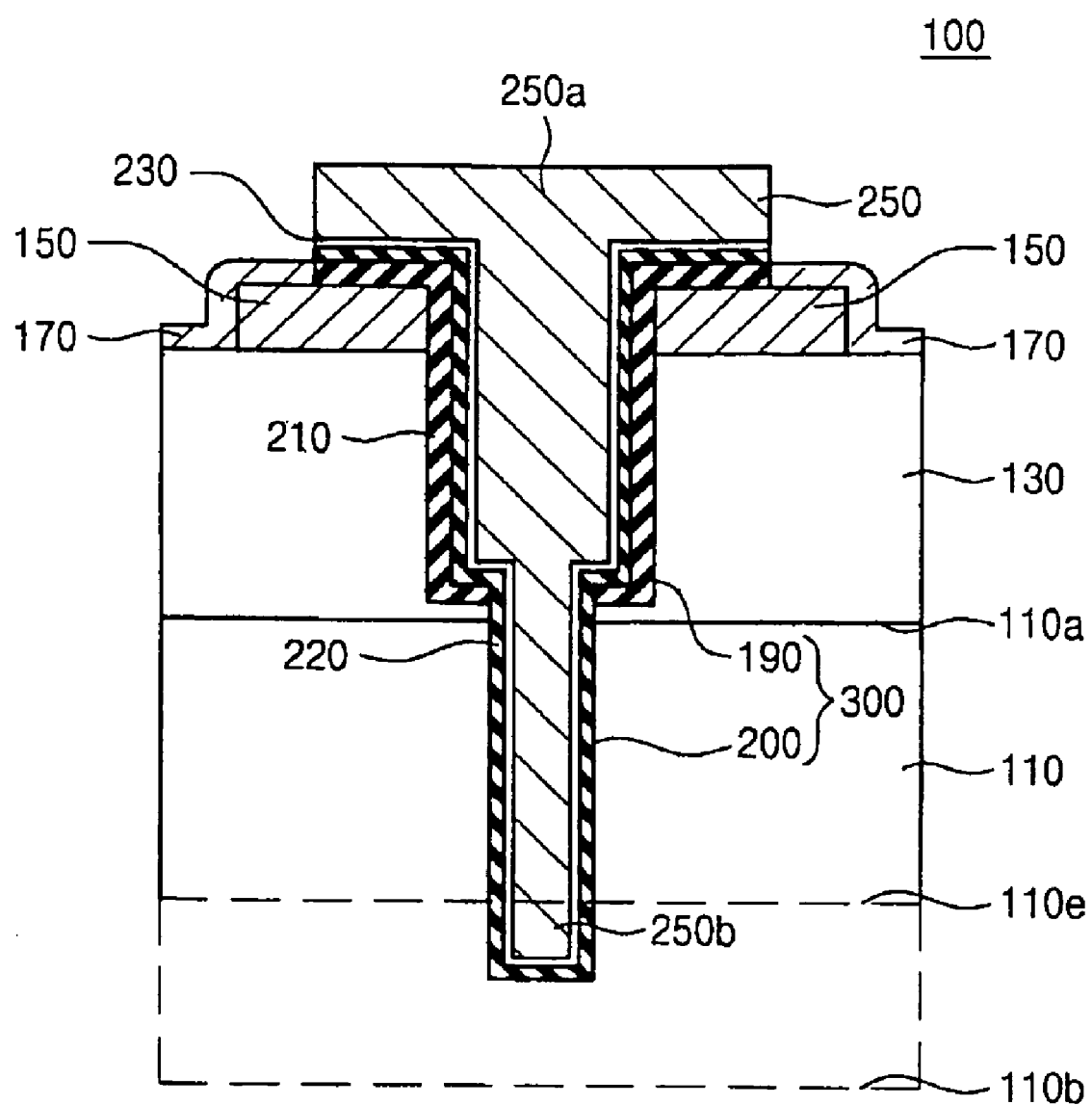
FIGS. 4A and 4B are cross sectional views illustrating methods of fabricating a semiconductor chip with through vias according to example embodiments.
Figure 4B:
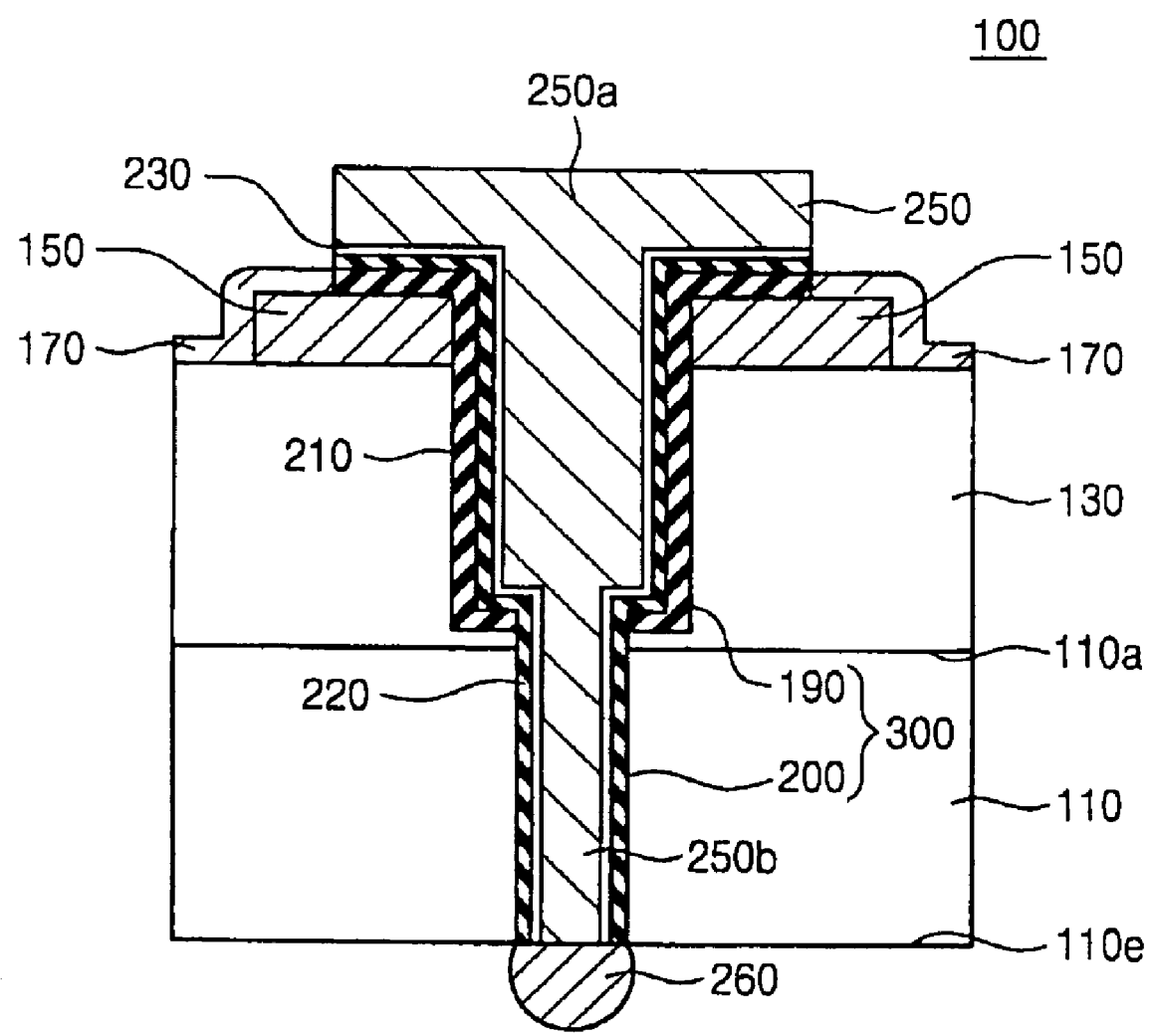
Figure 5:
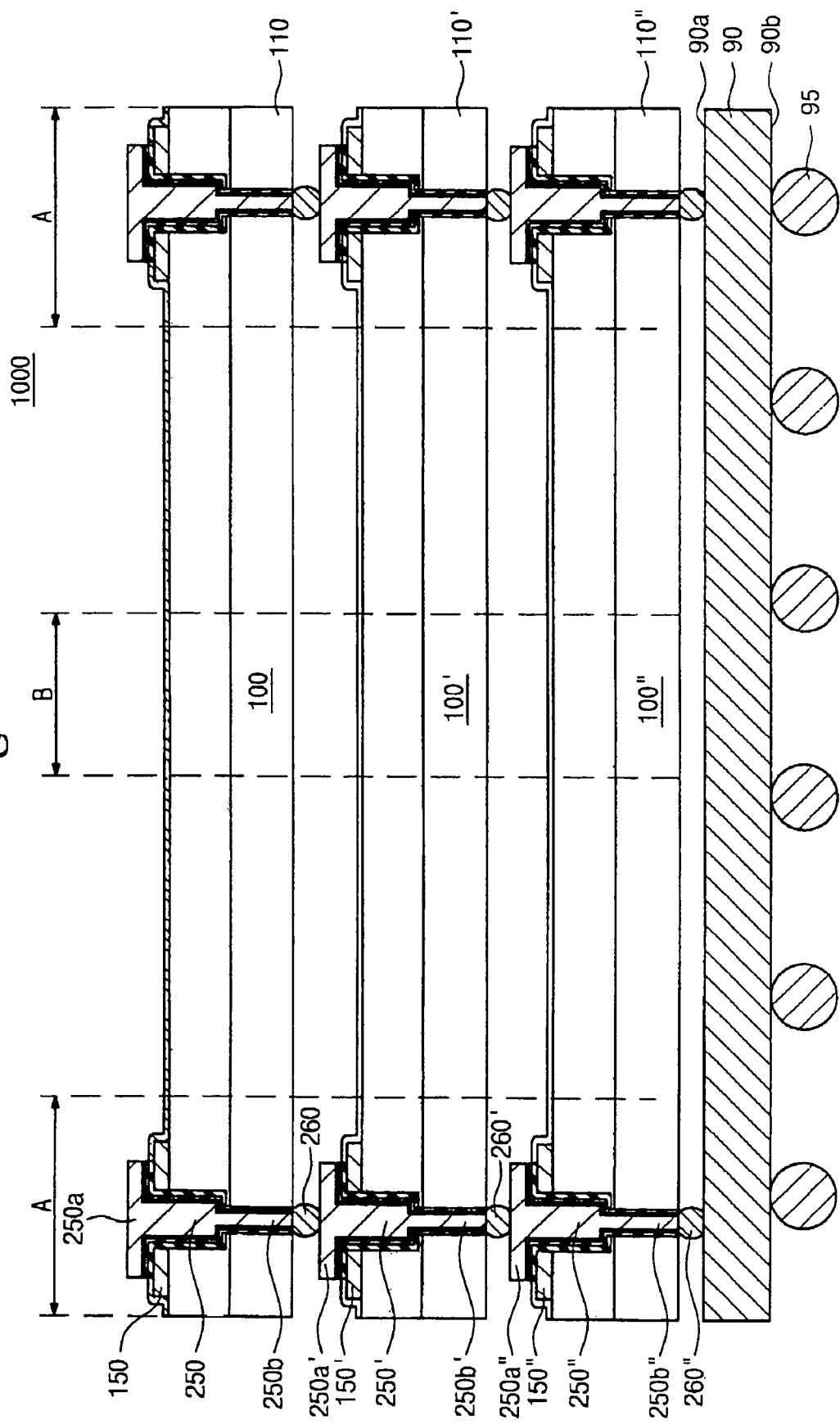

FIGS. 4A and 4B are cross sectional views illustrating methods of fabricating a semiconductor device having through vias in accordance with example embodiments, and FIG. 5 is a cross sectional view illustrating a multi chip package including a plurality of semiconductor chips fabricated according to example embodiments. The example embodiment illustrated in FIGS. 4A-5 is different from the example embodiment illustrated in FIGS. 2A-3 in terms of a method of protruding the lower portion of the through via from the wafer. Accordingly, the detailed description of the formation of the through via will be omitted.

Referring to FIG. 4A, the through via 250 may be formed using the same method as the example embodiment illustrated with reference to FIGS. 2A to 2F. The back lapping process described in the example embodiment illustrated in FIGS. 2A-2H may be applied to the inactive surface 110b of the wafer 110 until the lower portion 250b of the through via 250 is exposed. The inactive surface 110b may be moved to another surface 110e after the back lapping process. The exposed lower portion 250b may be planarized during the back lapping process. The lower portion 250b may be exposed using a single step of the back lapping process instead of the two steps of the back lapping process and the etching process which are used in the example embodiment illustrated in FIGS. 2A-2H.

Referring to FIG. 4B, a connector 260, e.g., a solder bump, a solder ball and/or another means of an electrical connector, may be further attached to the lower portion 250b of the through via 250. The connector 260 may be connected to an upper portion of another through via that penetrates another semiconductor chip positioned under the semiconductor chip 100.

Referring to FIG. 5, a plurality of semiconductor chips 100, 100' and 100" may be stacked on the substrate 90. Through vias 250, 250' and 250" may penetrate the uppermost chip 100, the intermediate chip 100' and the lowermost chip 100" respectively, as described with reference to FIG. 3. Further, connectors 260, 260' and 260" may be attached to the lower portions 250b, 250b' and 250b" of the through vias 250, 250' and 250", respectively.

The connector 260 attached to the uppermost chip 100 may be electrically connected to the upper portion 250a' of the through via 250' penetrating the intermediate chip 100', and the connector 260' attached to the intermediate chip 100' may be electrically connected to the upper portion 250a" of the through via 250" penetrating the lowermost chip 100". In addition, the connector 260" attached to the lowermost chip 100" may be electrically connected to a predetermined or given interconnection of the substrate 90. Example embodiments may, therefore, also provide a multi chip package 1000 that includes the plurality of stacked semiconductor chips 100, 100' and 100" with the through vias 250, 250' and 250" and the connectors 260, 260' and 260".

Figure 6A:
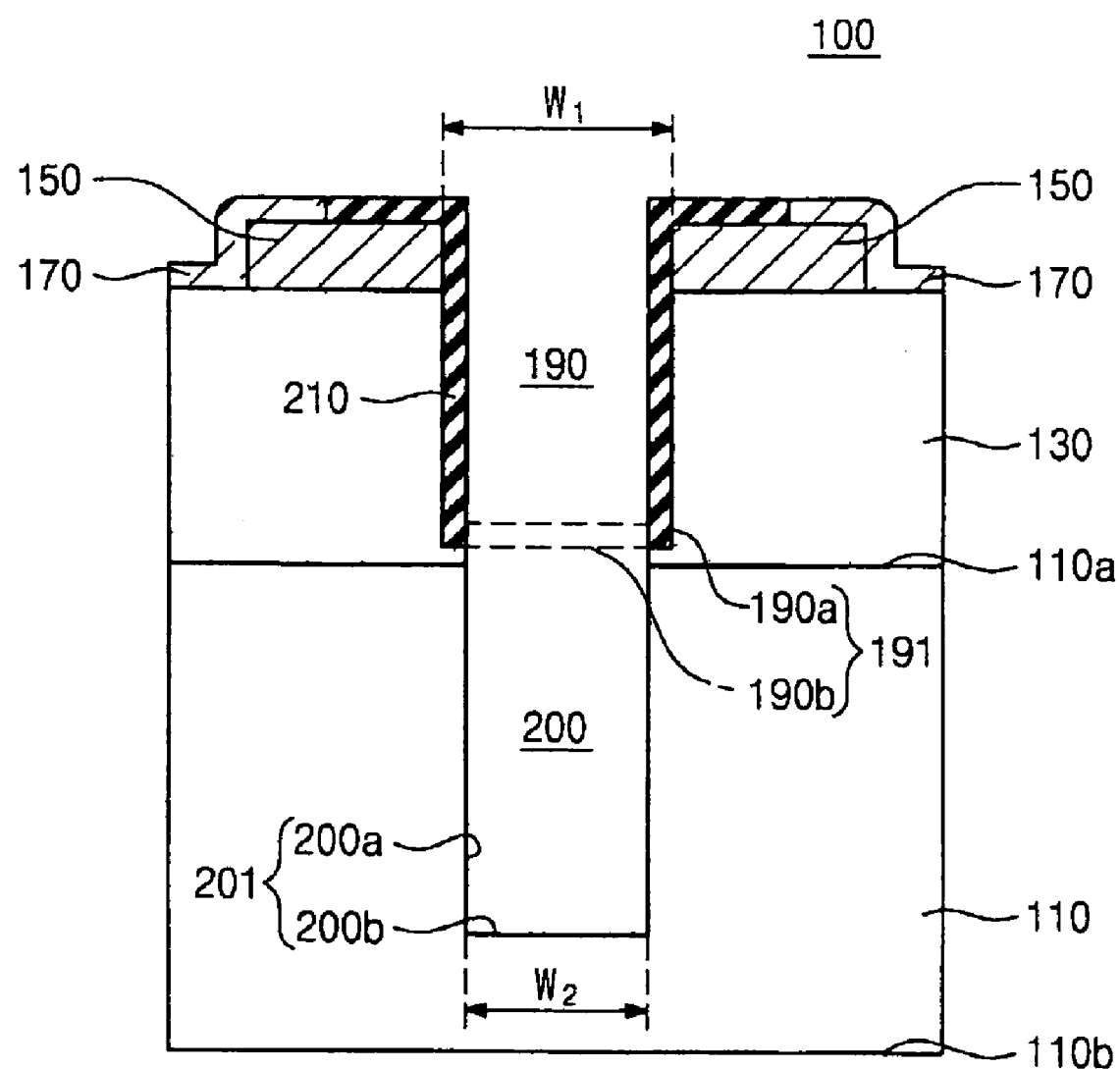
FIGS. 6A to 6D are cross sectional views illustrating methods of fabricating a semiconductor chip with through vias according to example embodiments.

FIGS. 6A to 6D are cross sectional views illustrating methods of fabricating a semiconductor chip with through vias according to example embodiments. Referring to FIG. 6A, the first hole 190 having a first width $W_1$ and the first hole insulating layer 210 may be formed using the same method as described with reference to FIGS. 2A and 2B. A second hole 200 having a second width $W_2$ may then be formed under the first hole 190 and may include inner wall 201 (including the sidewall 200a and the bottom surface 200b). In example embodiments, the second hole 200 may be formed so that a sidewall 200a of the second hole 200 may be self-aligned with the inner sidewall of the first hole insulating layer 210. Forming the second hole 200 may include etching the insulating layer 130 under the first hole 190 using a sidewall of the first hole insulating layer 210 as an etching mask. Alternatively, forming the second hole 200 may include laser drilling the insulating layer 130 under the first hole 190 along the first hole insulating layer 210. Accordingly, the difference between the first and second widths $W_1$ and $W_2$ may be much less than that of example embodiments illustrated in FIGS. 2A-2H.

The first hole insulating layer 210 may be formed using the same method as described in example embodiments illustrated in FIGS. 2A-2H. For example, the first hole insulating layer 210 may be formed of a silicon oxide (SiO) layer and/or a silicon nitride (SiN) layer using a chemical vapor deposition (CVD) technique. Alternatively, the first hole insulating layer 210 may be formed of an insulating layer, e.g., a polymer layer, using a spin coating technique and/or a sublimation technique. The first and second holes 190 and 200 may be formed using the same method as described in example embodiments illustrated in FIGS. 2A-2H. For example, the first and second holes 190 and 200 may be formed using one of a laser drilling technique and a plasma etching technique well known in the art, e.g., the laser drilling technique.

Figure 6B:
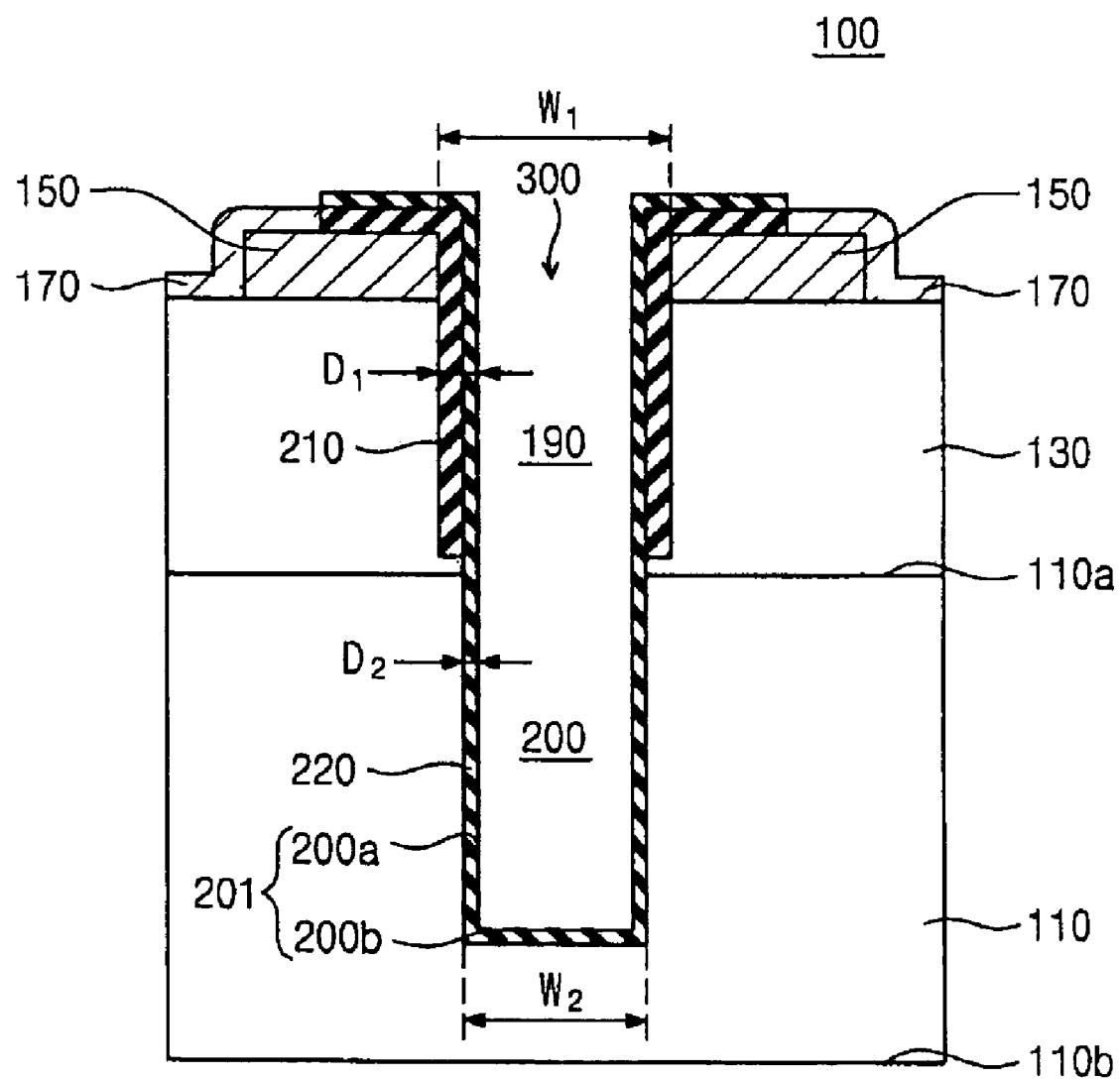

Referring to FIG. 6B, a second hole insulating layer 220 may be formed on the inner wall 201 (including the sidewall 200a and the bottom surface 200b) of the second hole 200 and on the first hole insulating layer 210. The second hole insulating layer 220 may also be formed using the same method as described in example embodiments illustrated in FIGS. 2A-2H. For example, the second hole insulating layer 220 may be formed of a silicon oxide (SiO) layer and/or a silicon nitride (SiN) layer using a chemical vapor deposition (CVD) technique, or an insulating layer, e.g., a polymer layer, using a spin coating technique and/or a sublimation technique. Alternatively, the first and second hole insulating layers 210 and 220 may be formed on all of the insulating layer 130 as depicted in FIG. 2E.

A double layered insulating layer having a first thickness $D_1$ may be formed in the first hole 190, and a single layered insulating layer having a second thickness $D_2$, which is less than the first thickness $D_1$, may be formed in the second hole 200. The double layered insulating layer may include the first and second hole insulating layers 210 and 220, and the single layered insulating layer may include only the second hole insulating layer 220. The first hole 190 and the second hole 200 may constitute a through via hole 300.

Figure 6C:
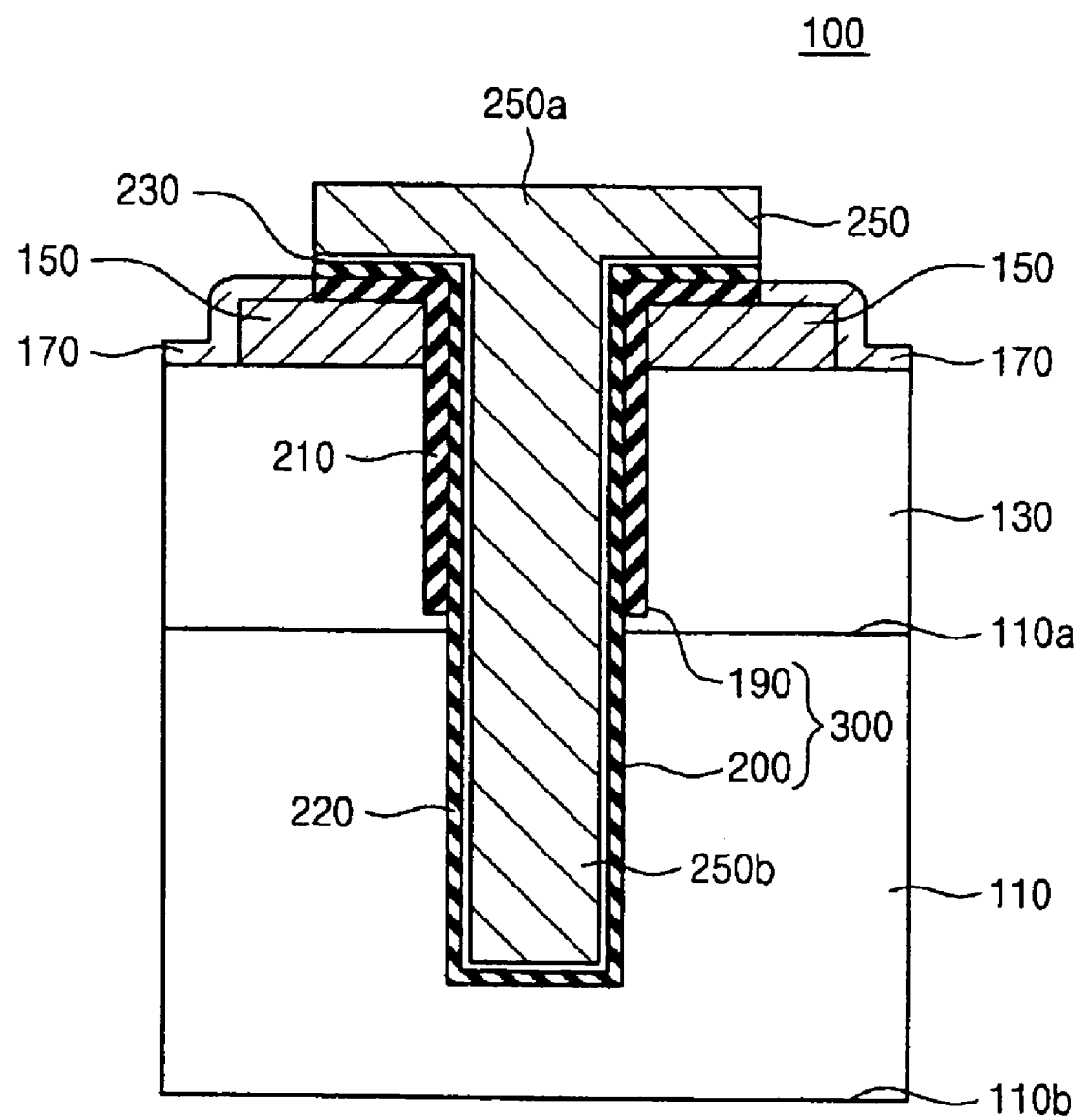

Referring to FIG. 6C, a conductive layer (not shown) may fill the through via hole 300 to form a through via 250. A base layer 230 may be formed on the second hole insulating layer 220 prior to formation of the through via 250. The base layer 230 may include a barrier layer and/or a seed layer. The through via 250 may be formed using an electroplating technique which is well known in the art. The through via 250 may be formed so that an upper portion 250a of the through via 250 extends to cover the pad 150. The through via 250 may be configured to electrically connect the pad 150 as illustrated in FIG. 2G.

The upper portion 250a of the through via 250 may be connected to a lower portion of a through via that penetrates a second semiconductor chip stacked on the semiconductor chip 100. Similarly, a lower portion 250b of the through via 250 may be connected to an upper portion of a through via that penetrates a third semiconductor chip located under the semiconductor chip 100. Thus, the lower portion 250b of the through via 250 may protrude from the wafer 110.

Figure 6D:
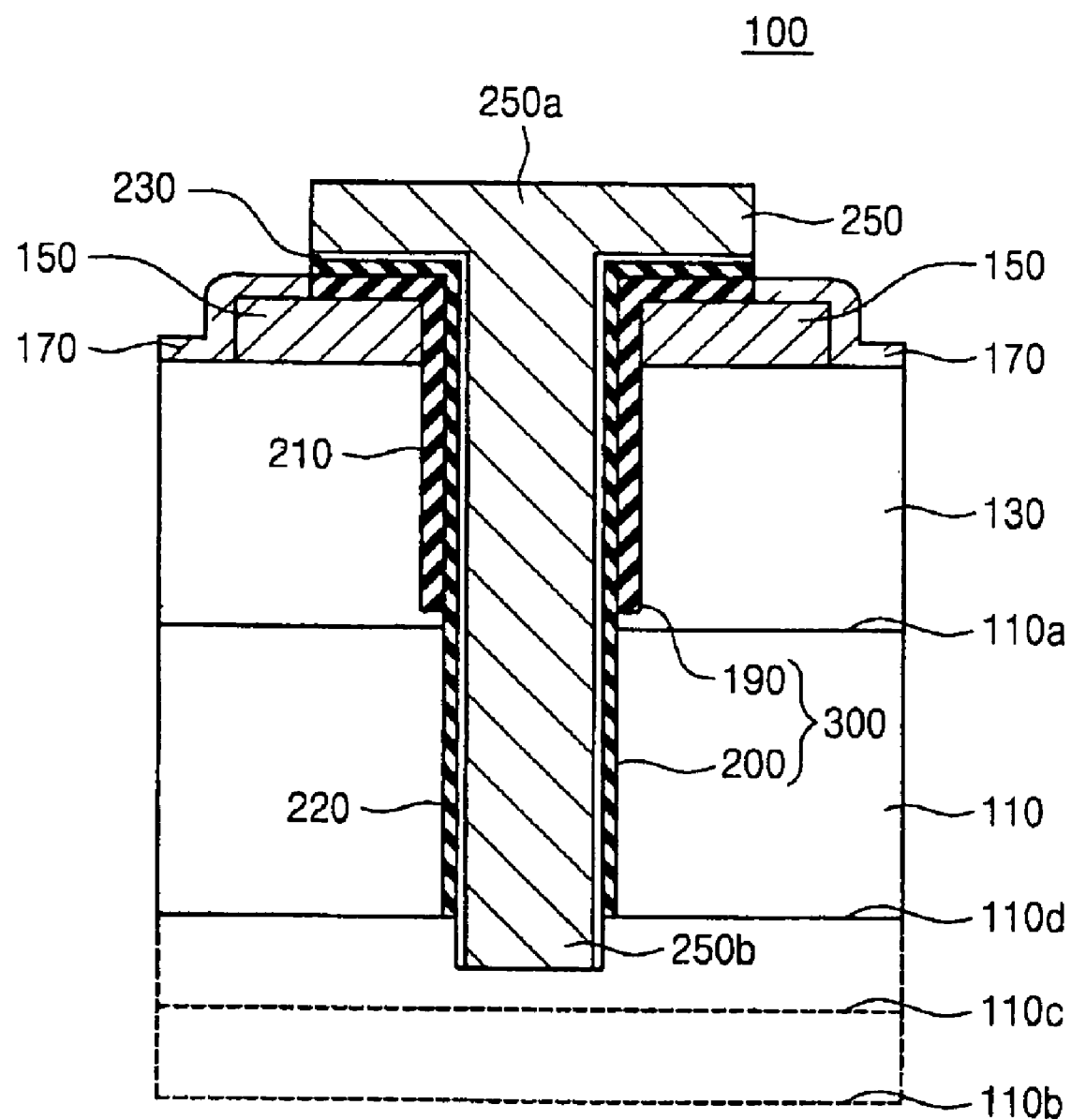

Referring to FIG. 6D, a back lapping process may be applied to the inactive surface 110b of the wafer 110 to remove a portion of the wafer 110. The back lapping process may be stopped before the lower portion 250b of the through via 250 is exposed. For example, the inactive surface 110b may be moved to a first surface 110c after the back lapping process. Subsequently, an etching process may be applied to the first surface 110c so that the lower portion 250b of the through via 250 may protrude. The first surface 110c may be moved to a second surface 110d after the etching process. Therefore, the lower portion 250b of the through via 250 may protrude from the second surface 110d of the wafer 110 after the etching process.

FIG. 7 is a cross sectional view illustrating a multi chip package including a plurality of semiconductor chips fabricated according to example embodiments. Referring to FIG. 7, a plurality of semiconductor chips 100, 100' and 100" may be stacked on a top surface 90a of a substrate 90, e.g., PCB, and a plurality of external connectors 95, e.g., solder balls and/or solder bumps, may be attached on a bottom surface 90b of the substrate 90. Through vias 250, 250' and 250" may penetrate the uppermost semiconductor chip 100, the intermediate semiconductor chip 100' and the lowermost semiconductor chip 100", respectively. The uppermost chip 100 may include a wafer 110 and pads 150 arrayed over the wafer 110, and the intermediate chip 100' may include a wafer 110' and pads 150' arrayed over the wafer 110'. Similarly, the lowermost chip 100" may include a wafer 110", and pads 150" may be arrayed over the wafer 110".

A lower portion 250b of the through via 250 may be electrically connected to an upper portion 250a' of the through via 250', and a lower portion 250b' of the through via 250' may be electrically connected to an upper portion 250a" of the through via 250". In addition, a lower portion 250b" of the through via 250" may be electrically connected to a predetermined or given interconnection of the substrate 90. Example embodiments may, therefore, provide a multi chip package 1000 that includes the plurality of stacked semiconductor chips 100, 100' and 100" with the through vias 250, 250' and 250".

In example embodiments, the through vias 250, 250' and 250" may be disposed at an edge A of the semiconductor chips 100, 100' and 100", as shown in FIG. 7. Example embodiments, however, are not limited. For example, at least one of the through vias 250, 250' and 250" may be disposed at a center region B of the semiconductor chips 100, 100' and 100". In other words, example embodiments may be applied to semiconductor chips having center pads. Further, stacking the plurality of chips 100, 100' and 100" may be achieved at a chip level or wafer level, as described with reference to FIG. 3.

Figure 8A:
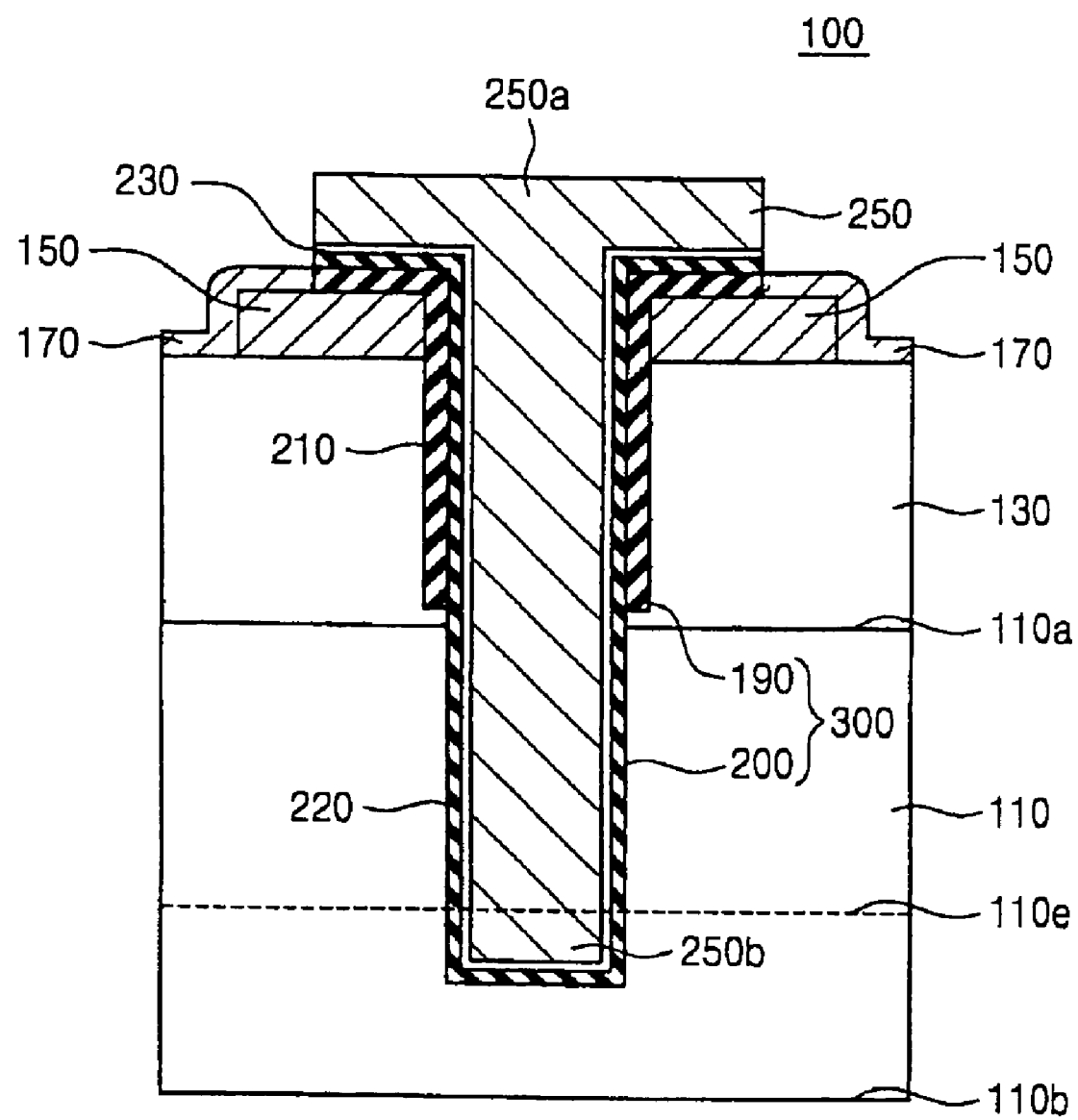
FIGS. 8A and 8B are cross sectional views illustrating methods of fabricating a semiconductor chip with through vias according to example embodiments.
Figure 8B:
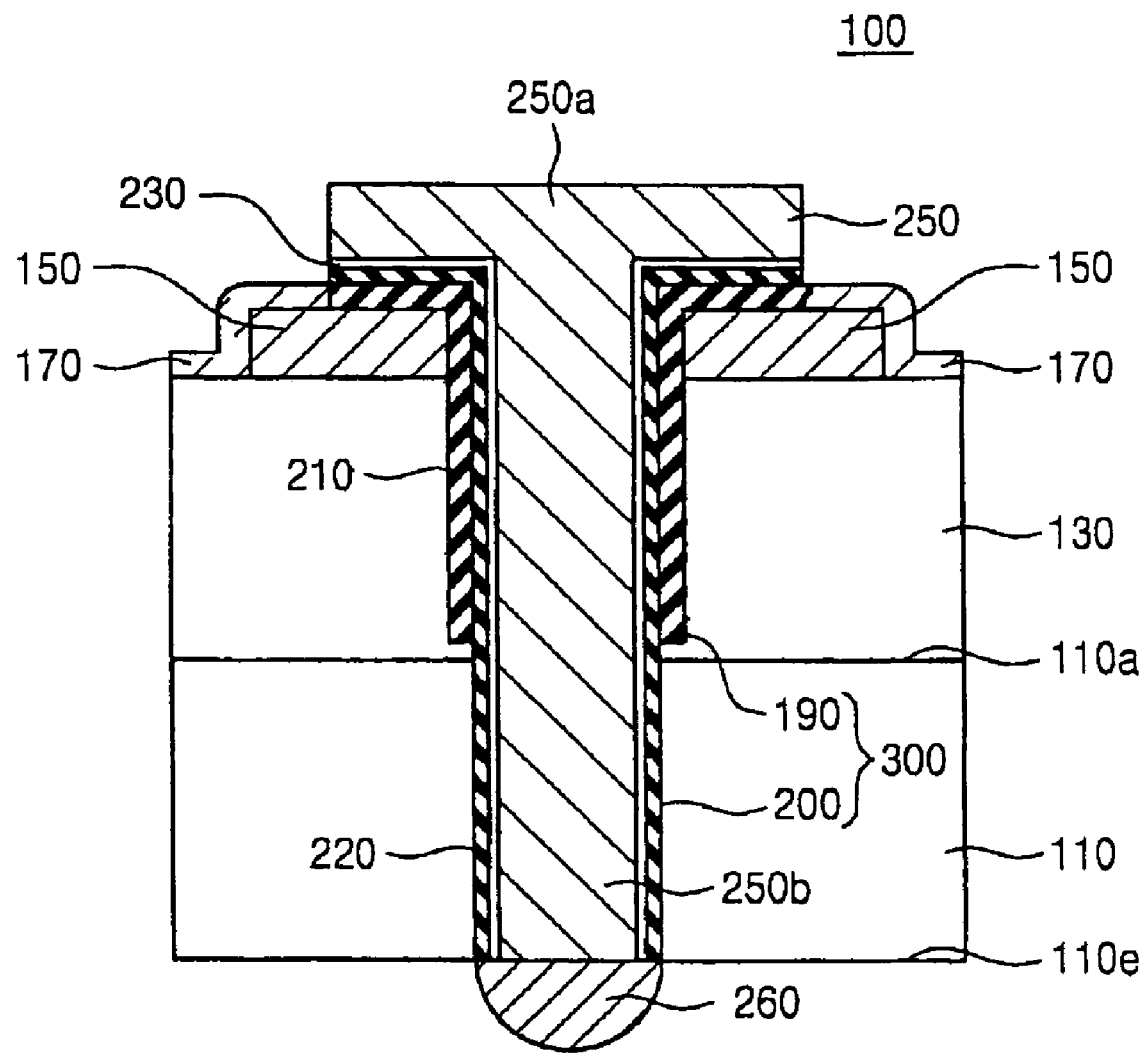
Figure 9:
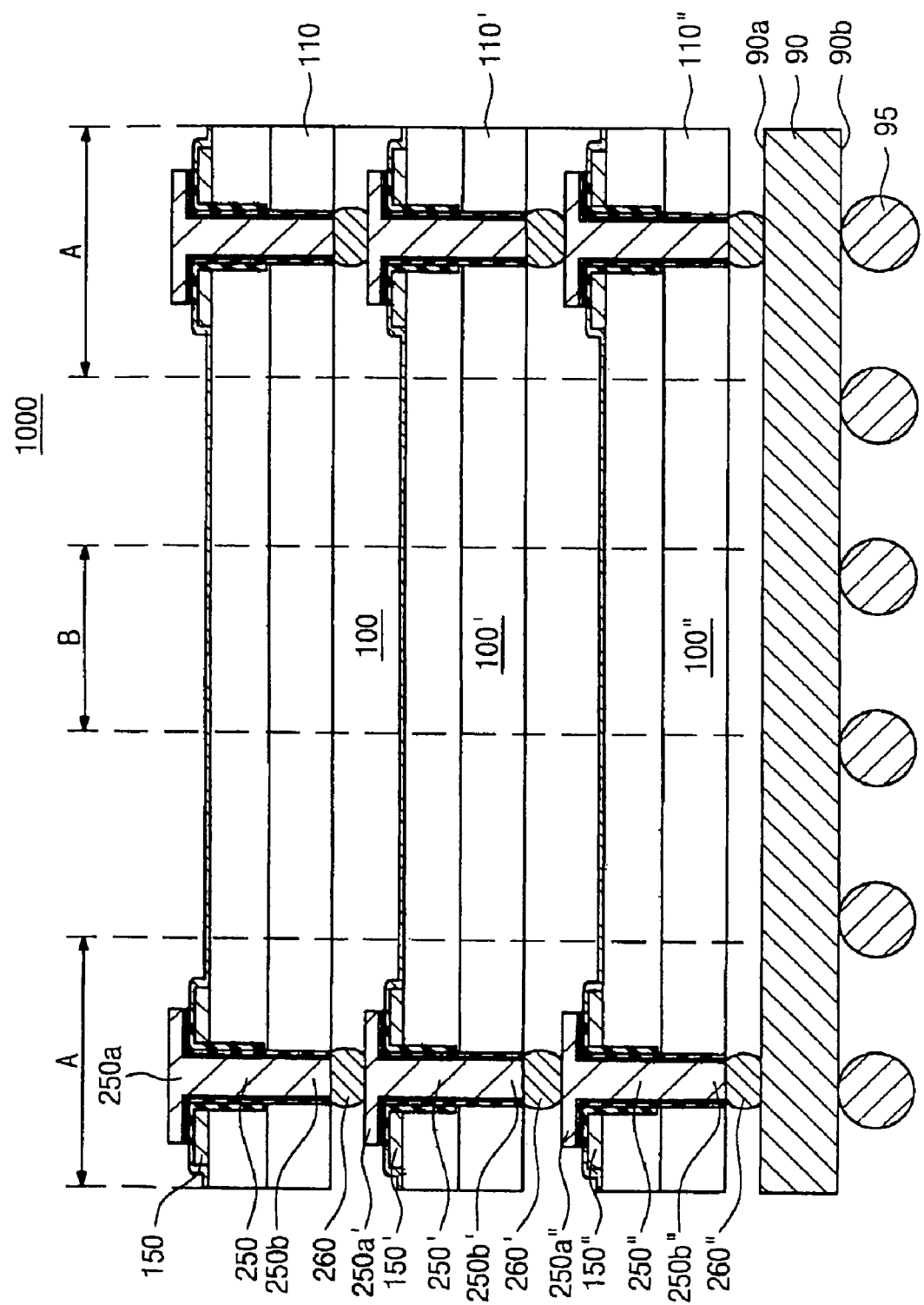

FIGS. 8A and 8B are cross sectional views illustrating methods of fabricating a semiconductor device having through vias in accordance with example embodiments, and FIG. 9 is a cross sectional view illustrating a multi chip package including a plurality of semiconductor chips fabricated according to example embodiments. Example embodiments illustrated in FIGS. 8A and 8B are different from example embodiments illustrated in FIGS. 6A-6D in terms of a method of protruding the lower portion of the through via from the wafer. Accordingly, the detailed description to formation of the through via will be omitted in FIGS. 8A-8B.

Referring to FIG. 8A, the through via 250 may be formed using the same method as example embodiments illustrated with reference to FIGS. 6A to 6C. The back lapping process described in example embodiments illustrated with reference to FIGS. 6A to 6C may be applied to the inactive surface 110b of the wafer 110 until the lower portion 250b of the through via 250 is exposed. The inactive surface 110b may be moved to a third surface 110e after the back lapping process. The exposed lower portion 250b may be planarized during the back lapping process. The lower portion 250b may be exposed using a single step of the back lapping process instead of the two steps of the back lapping process and the etching process which are used in example embodiments illustrated in FIGS. 6A-6D.

Referring to FIG. 8B, a connector 260, e.g., a solder bump and/or a solder ball, may be formed to connect to the lower portion 250b of the through via 250. The connector 260 may be connected to an upper portion of another through via that penetrates another semiconductor chip positioned under the semiconductor chip 100.

Referring to FIG. 9, a plurality of semiconductor chips 100, 100' and 100" may be stacked on the substrate 90. Through vias 250, 250' and 250" may penetrate the uppermost chip 100, the intermediate chip 100' and the lowermost chip 100" respectively, as described with reference to FIG. 9. Further, connectors 260, 260' and 260" may be attached to the lower portions 250b, 250b' and 250b" of the through vias 250, 250' and 250", respectively.

The connector 260 attached to the uppermost chip 100 may be electrically connected to the upper portion 250a' of the through via 250' penetrating the intermediate chip 100', and the connector 260' attached to the intermediate chip 100' may be electrically connected to the upper portion 250a" of the through via 250" penetrating the lowermost chip 100". In addition, the connector 260" attached to the lowermost chip 100" may be electrically connected to a predetermined or given interconnection of the substrate 90. Example embodiments may also provide a multi chip package 1000 that includes the plurality of stacked semiconductor chips 100, 100' and 100" with the through vias 250, 250' and 250" and the connectors 260, 260' and 260".

According to example embodiments, a first hole may be formed in an insulating layer deposited on a wafer, and a first hole insulating layer may be formed on the inner wall of the first hole prior to formation of a second hole in the wafer. Accordingly, even though fragments of the wafer are generated during formation of the second hole in the wafer and the fragments splash onto the inner wall of the first hole, the first hole insulating layer may prevent or reduce the wafer from being electrically connected to conductors, e.g., pads on the insulating layer.

While example embodiments have been particularly shown and described with reference to embodiments thereof, it will be understood by those of ordinary skill in the art that various changes in form and details may be made therein without departing from the spirit and scope of the following claims.

What is claimed is:

1. A semiconductor device, comprising:
   a wafer having an active surface and an inactive surface which face each other, an insulating layer being disposed on the active surface;
   a pad and a passivation layer on the insulating layer, the passivation layer covering a portion of the pad;
   a through via hole penetrating the wafer, the through via hole including a first hole in the insulating layer and a second hole extending from the first hole into the wafer;
   a hole insulating layer on the inner wall of the through via hole, the hole insulating layer including a multi-layered insulating layer on an inner wall of the first hole and a single layered insulating layer on an inner wall of the second hole; and
   a through via in the through via hole.

2. The semiconductor device of claim 1, wherein a bottom surface of the first hole is located in the insulating layer to leave a portion of the insulating layer between the bottom surface of the first hole and the active surface of the wafer.

3. The semiconductor device of claim 2, wherein the first hole comprises a first sidewall and a bottom surface, and the second hole comprises a second sidewall extending from the bottom surface of the first hole.

4. The semiconductor device of claim 3, wherein the hole insulating layer comprises a first hole insulating layer and a second hole insulating layer covering the first hole insulating layer, wherein the first hole insulating layer is disposed on the first sidewall and the bottom surface, and wherein the second hole insulating layer is disposed on the first sidewall, the second sidewall and the bottom surface.

5. The semiconductor device of claim 2, wherein the first hole comprises a first sidewall, and the second hole comprises a second sidewall extending from the first sidewall of the first hole.

6. The semiconductor device of claim 5, wherein the hole insulating layer comprises a first hole insulating layer and a second hole insulating layer covering the first hole insulating layer, wherein the first hole insulating layer is disposed on the first sidewall, and the second hole insulating layer is disposed on the first sidewall and the second sidewall.

7. The semiconductor device of claim 1, wherein the first hole has a first width, and the second hole has a second width which is equal to or less than the first width.

8. The semiconductor device of claim 1, wherein the through via comprises an upper portion that penetrates the pad to protrude from the active surface and a lower portion which is exposed through the inactive surface.

* * * * *